United States Patent
Jin et al.

(10) Patent No.: US 11,204,415 B2
(45) Date of Patent: Dec. 21, 2021

(54) THREE-DIMENSIONAL (3D) IMAGE SENSORS INCLUDING POLARIZER, AND DEPTH CORRECTION METHODS AND 3D IMAGE GENERATION METHODS BASED ON 3D IMAGE SENSORS

(71) Applicant: Samsung Electronics Co., Ltd., Suwon-si (KR)

(72) Inventors: Young-gu Jin, Suwon-si (KR); Young-chan Kim, Seongnam-si (KR); Chang-rok Moon, Seoul (KR); Yong-hun Kwon, Hwaseong-si (KR); Tae-sub Jung, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 455 days.

(21) Appl. No.: 16/356,023

(22) Filed: Mar. 18, 2019

(65) Prior Publication Data
US 2020/0103511 A1 Apr. 2, 2020

(30) Foreign Application Priority Data
Oct. 1, 2018 (KR) .................. 10-2018-0117219

(51) Int. Cl.
*G01S 7/499* (2006.01)
*H01L 27/146* (2006.01)
(Continued)

(52) U.S. Cl.
CPC ............ *G01S 7/499* (2013.01); *G01S 7/4816* (2013.01); *G01S 17/42* (2013.01); *G02B 5/3058* (2013.01);
(Continued)

(58) Field of Classification Search
CPC ........ G01S 7/499; G01S 7/4816; G01S 17/42; G02B 5/3058; H01L 27/14607; H01L 27/14625; H01L 27/1463; H01L 27/14643
See application file for complete search history.

(56) References Cited

U.S. PATENT DOCUMENTS 9,442,196 B2   9/2016  Buettgen et al.
9,778,556 B2  10/2017  Khromov et al.
(Continued)

FOREIGN PATENT DOCUMENTS

JP      5541653 B2       7/2014
WO   WO-2016-199594 A1  12/2016
WO   WO-2017-121820 A1   7/2017

OTHER PUBLICATIONS

"Beyond Conventional Imaging: Sony's Polarized Sensor" Lucid Vision Labs, 2018, https://thinklucid.com/tech-briefs/polarization-explained-song-polarized-sensor/, retrieved via the internet.

(Continued)

*Primary Examiner* — Kevin K Pyo
(74) *Attorney, Agent, or Firm* — Harness, Dickey & Pierce, P.L.C.

(57) ABSTRACT

A 3D image sensor include a depth pixel and at least two polarization pixels adjacent to the depth pixel. The depth pixel includes a charge generation region in a substrate. The depth pixel is configured to generate depth information associated with a depth of an object from the 3D image sensor in a 3D scene based on detecting light reflected from the object. Each polarization pixel includes a photodiode in the substrate and a polarizer on the substrate in a light-incident direction. The polarization pixel is configured to generate shape information associated with a shape of a surface of the object in the 3D scene based on detecting light reflected from the object. The polarization pixels and the (Continued)

depth pixel collectively define a unit pixel. The respective polarizers are associated with different polarization directions.

20 Claims, 35 Drawing Sheets

(51) Int. Cl.
    *G01S 7/481*     (2006.01)
    *G02B 5/30*     (2006.01)
    *G01S 17/42*     (2006.01)

(52) U.S. Cl.
    CPC .... *H01L 27/1463* (2013.01); *H01L 27/14607* (2013.01); *H01L 27/14625* (2013.01); *H01L 27/14643* (2013.01)

(56) References Cited

U.S. PATENT DOCUMENTS

| | | | |
|---|---|---|---|
| 10,557,705 B2 * | 2/2020 | Kadambi | G01B 11/24 |
| 2013/0188023 A1 | 7/2013 | Kuang et al. | |
| 2016/0261844 A1 | 9/2016 | Kadambi et al. | |
| 2016/0306045 A1 | 10/2016 | Van Der Tempel et al. | |
| 2017/0248796 A1 | 8/2017 | Banks et al. | |
| 2018/0100731 A1 | 4/2018 | Pau | |
| 2018/0302597 A1 | 10/2018 | Honda | |
| 2021/0144325 A1 * | 5/2021 | Jin | H04N 5/378 |

OTHER PUBLICATIONS

Kadambi et al., "Polarized 3D: High-Quality Depth Sensing with Polarization Cues", Proceedings of the IEEE International Conference on Computer Vision, 2015.

* cited by examiner

THREE-DIMENSIONAL (3D) IMAGE SENSORS INCLUDING POLARIZER, AND DEPTH CORRECTION METHODS AND 3D IMAGE GENERATION METHODS BASED ON 3D IMAGE SENSORS

CROSS-REFERENCE TO RELATED APPLICATION

This application claims the benefit of Korean Patent Application No. 10-2018-0117219, filed on Oct. 1, 2018, in the Korean Intellectual Property Office, the disclosure of which is incorporated herein in its entirety by reference.

BACKGROUND

The inventive concepts relate to three-dimensional (3D) image sensors, and more particularly, to 3D image sensors including a polarizer.

3D image sensors are sensor configured to obtain depth information associated with a depth of an object from the sensor within a scene and may calculate a depth of a face or an article from the sensor within a scene and generate a 3D image of the face or the article based on the depth information. 3D image sensors may be generally classified into an active type and/or a passive type. Active type 3D image sensors may emit light of a particular type from a light source, irradiate the light to an object, and obtain depth information associated with the object based on detecting the light reflected from the object. Passive type 3D image sensors may obtain the depth information associated with the object based on detecting the natural light reflected from the object without a separate light source. The active type 3D image sensors may include a time of flight (ToF) type and a structured light type. The passive type 3D image sensors may include a stereo type, a multi-camera type, a multi-photodiode (multi-PD) type, etc.

SUMMARY

The inventive concepts provide 3D image sensors that accurately detect shape information of a surface of an object as well as depth information of the object, and depth correction methods and three-dimensional (3D) image generation methods based on the 3D image sensor.

According to some example embodiments, a three-dimensional (3D) image sensor may include a depth pixel. The depth pixel may include a charge generation region in a substrate. The depth pixel may be configured to generate depth information associated with a depth of an object from the 3D image sensor in a 3D scene based on detecting light reflected from the object. The 3D image sensor may include at least two polarization pixels adjacent to the depth pixel. Each polarization pixel may include a photodiode in the substrate and a polarizer on the substrate in a light-incident direction. Each polarization pixel may be configured to generate shape information associated with a shape of a surface of the object in the 3D scene based on detecting light reflected from the object. The at least two polarization pixels and the depth pixel may collectively define a unit pixel. The respective polarizers of the at least two polarization pixels may be associated with different polarization directions.

According to some example embodiments, a three-dimensional (3D) image sensor may include a unit pixel. The unit pixel may include a charge generation region in a center of a pixel in a substrate and at least two polarizers on the substrate in a light-incident direction. The at least two polarizers may be associated with different polarization directions. The 3D image sensor may be configured to generate depth information associated with a depth of an object from the 3D image sensor in a 3D scene based on detecting light reflected from the object and shape information associated with a shape of a surface of the object in the 3D scene based on detecting light reflected from the object.

According to some example embodiments, a depth correction method based on a three-dimensional (3D) image sensor may include calculating a depth of an object from the 3D image sensor based on processing sensor data generated by a depth pixel of the 3D image sensor in response to the depth pixel detecting light reflected from the object. The method may include calculating a normal vector based on polarization information based on processing sensor data generated by a pixel having a polarizer arranged therein in response to the pixel having the polarizer therein detecting light reflected from the object. The method may include correcting the depth based on the normal vector. The 3D image sensor may include the depth pixel and a polarization pixel having the polarizer arranged therein in a periphery of the depth pixel, or the depth pixel having the polarizer arranged therein.

According to some example embodiments, a depth correction method based on a three-dimensional (3D) image sensor may include calculating a depth of an object from the 3D image sensor based on processing sensor data generated by a time of flight (ToF)-based depth pixel of the 3D image sensor in response to the depth pixel detecting light reflected from the object. The method may include determining whether a rate of maximum values with respect to minimum values for a phase of each depth pixel exceeds a threshold value. The method may include calculating a normal vector based on polarization information based on processing sensor data generated by a pixel having a polarizer arranged therein, in response to the pixel having the polarizer therein detecting light reflected from the object and the rate not exceeding the threshold value. The method may include correcting the depth based on the normal vector. The 3D image sensor may include the depth pixel and a polarization pixel having the polarizer arranged therein in a periphery of the depth pixel, or the depth pixel having the polarizer arranged therein.

According to some example embodiments, a three-dimensional (3D) image generation method based on a 3D image sensor may include detecting a phase signal of an object based on processing sensor data generated by a depth pixel of the 3D image sensor in response to the depth pixel detecting light reflected from the object. The method may include calculating a normal vector based on polarization information based on processing sensor data generated by a pixel having a polarizer arranged therein in response to the pixel having the polarizer therein detecting light reflected from the object and computing a 3D shape of the object. The method may include calculating a depth of the object based on the phase signal. The method may include generating a 3D image of the object based on combining depth information associated with the calculated depth with 3D shape information associated with the computed 3D shape of the object. The 3D image sensor may include the depth pixel and a polarization pixel having the polarizer arranged therein in a periphery of the depth pixel, or the depth pixel having the polarizer arranged therein.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

Figure 1:
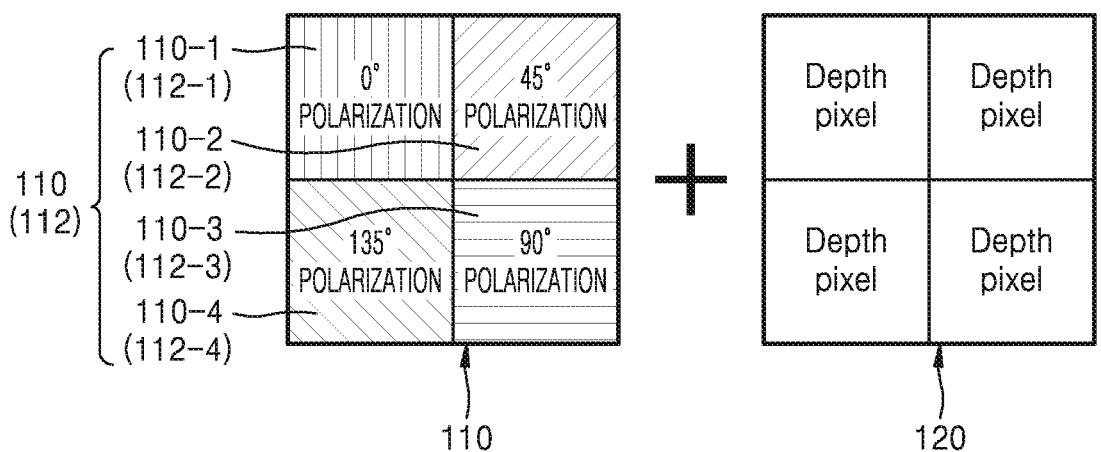
FIG. 1 is a conceptual diagram of a three-dimensional (3D) image sensor according to some example embodiments of the inventive concepts.

Hereinafter, example embodiments of the inventive concepts will be described in detail with reference to the accompanying drawings Like components in the drawings will be referred to as like reference numerals, and will not be repeatedly described.

FIG. 1 is a conceptual diagram of a three-dimensional (3D) image sensor according to some example embodiments of the inventive concepts.

Referring to FIG. 1, a 3D image sensor 100 according to some example embodiments of the inventive concepts may have a structure where a polarizer 112 and a depth pixel 120 are combined to collectively define a unit pixel (UP) of the 3D image sensor 100. Herein, a unit pixel that results from a combination of the polarizer 112 and the depth pixel 120 may include a first coupling structure where a polarization pixel (see 110 of FIG. 2A, etc.) including the polarizer 112 and the depth pixel 120 are combined, and a second coupling structure where the polarizer 112 is arranged on the depth pixel 120. The 3D image sensor 100 may include at least two polarizers 112 (e.g., 112-1 to 112-4), where the respective polarizers 112 of the at least two polarizers 112 are associated with different polarization directions to detect surface shape information of an object.

Herein, the depth pixel 120 may mean a pixel used by a general existing 3D image sensor. The depth pixel 120 may be classified into several types depending on a scheme to detect depth information of the object. For example, the depth pixel 120 may be classified into an active type and a passive type depending on whether a light source is used by the 3D image sensor to emit light that is detected by the depth pixel 120 based on reflection of the emitted light from an object or not. The active type may include a time of flight (ToF) type, a structured light type, etc., and the passive type may include a stereo type, a multi-camera type, a multi-photodiode (multi-PD) type, etc.

The polarization pixel 110 is used in a polarization sensor capable of generating shape information associated with a shape of a surface of the object in a 3D scene based on detecting light reflected from the object and may include the polarizer 112. For example, the polarization pixel 110 may have a structure where the polarizer 112 is arranged on a general pixel including a photodiode. The polarization pixel 110 may also have a structure where the polarizer 112 is arranged on a depth pixel. In some example embodiments, hereinbelow, to distinguish the first coupling structure from the second coupling structure, the polarization pixel 110 may mean only a structure where the polarizer 112 is arranged on the general pixel.

A polarization sensor including the polarization pixels 110 (e.g., 110-1 to 110-4) may detect a change in polarized light incident through (e.g., received at) different polarizers 112 (e.g., 112-1 to 112-4), where the light is reflected from an object in a 3D scene, thus calculating a normal vector with respect to the surface of the object. Once the normal vector with respect to the surface of the object is calculated, the shape information associated with the shape of the surface of the object may be computed. In this way, the polarization sensor may generate the shape information associated with the shape of the surface of the object by using the polarization pixels 110.

Generally, an existing 3D image sensor may accurately measure the depth of the object from the 3D image sensor in a 3D scene by using the depth pixel 120, where the depth pixel 120 may be configured to generate and detects depth information of associated with a depth of an object from the 3D image sensor 100 in a 3D scene based on detecting light reflected from the object, failing in accurately measuring the shape of the surface of the object due to an error such as a flying pixel phenomenon, a multi-path interference phenomenon, etc. Herein, the flying pixel phenomenon means a phenomenon where a depth information error occurs in a pixel corresponding to an interface of a rapidly changing object, and the multi-path interference phenomenon means a phenomenon where a depth information error occurs due to diffuse reflection.

Meanwhile, the polarization sensor may generate shape information enabling accurate calculation of the shape of the surface of the object by using the polarization pixels 110, but may not measure the depth of the object from the 3D image sensor in the 3D scene.

The 3D image sensor 100 according to some example embodiments has a structure where the polarizer 112 and the depth pixel 120 are combined, thus solving problems of the inaccuracy of the shape information associated with the shape of the surface of the object of the existing 3D image sensor including the depth pixel 120 and the impossibility of measurement of the depth of the object from the 3D image sensor in the 3D scene by the polarization sensor including the polarization pixel 110, and accordingly, the 3D image sensor may be configured to generate accurate depth information associated with the object and the shape information associated with the shape of the surface of the object. A depth pixel 120 may be combined with at least two polarization pixels 110 to collectively define a unit pixel of the 3D image sensor, and the 3D image sensor may include a plurality of such unit pixels.

FIGS. 2A, 2B, 2C, and 2D are conceptual diagrams showing a structure where polarization pixels and depth pixels are mixed ("combined") in 3D image sensors according to some example embodiments of the inventive concepts.

Referring to FIGS. 2A through 2D, 3D image sensors 100a-M, 100b-M, 100c-M, and 100d-M according to some example embodiments may have the first coupling structures where the polarization pixel 110 and depth pixels 120, 120a, and 120b are mixed, respectively. As shown in FIGS. 2A through 2D, the 3D image sensors 100a-M, 100b-M, 100c-M, and 100d-M may each include at least one unit pixel UP1 to UP4, where the at least one unit pixel is collectively defined by at least one depth pixel 120 and at least two polarization pixels 110 that are adjacent to the at least one depth pixel 120.

As shown in FIGS. 2A-2D, the pixel structure of a unit pixel UP of a 3D image sensor 100 may be one structure of various structures.

Figure 2A:
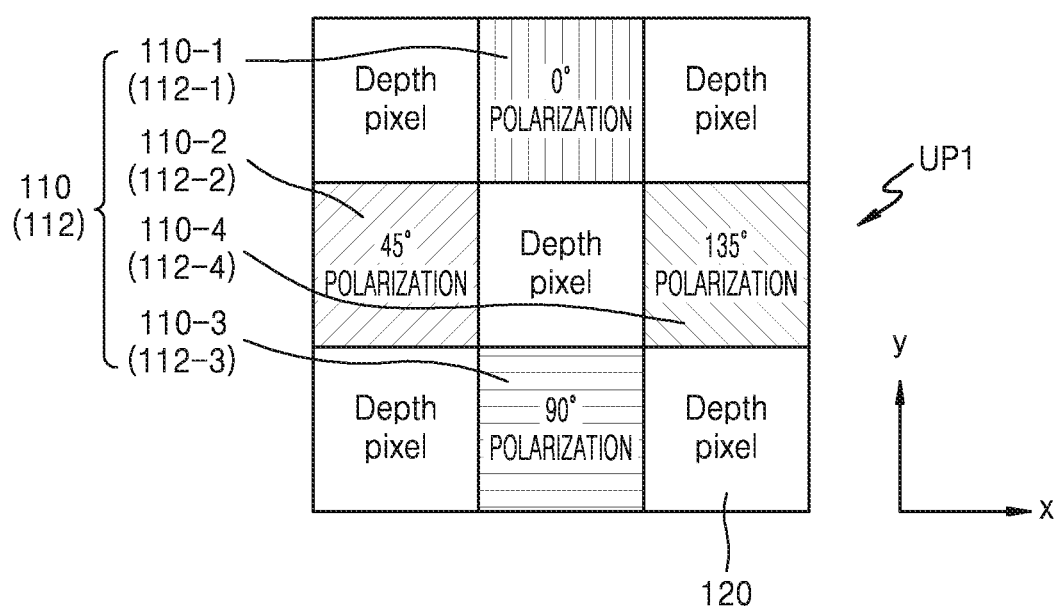
FIGS. 2A, 2B, 2C, and 2D are conceptual diagrams showing a structure where polarization pixels and depth pixels are combined in 3D image sensors according to some example embodiments of the inventive concepts.

More specifically, in the 3D image sensor 100a-M of FIG. 2A, the polarization pixels 110 and the depth pixels 120 may be coupled in ("may define") a checkerboard pattern where they are arranged alternately ("define an alternating pattern of polarization pixels 110 and depth pixels 120") in both a first direction (an x direction) and in a second direction (a y direction). A unit pixel UP1 of the 3D image sensor 100a-M may include four polarization pixels 110 and four depth pixels 120, which are arranged alternately. Restated, as shown in FIG. 2A, the pixel structure of the unit pixel UP1 may have a first structure including four depth pixels 120 and four polarization pixels 110 that collectively define a checkerboard pattern of alternating depth pixels 120 and polarization pixels 110. The unit pixel UP1 may have an array structure in which polarization pixels arranged in a rhombus shape and depth pixels arranged in the rhombus shape overlap. In this structure, for a 3×3 array of FIG. 2A, one depth pixel 120 is arranged in the center of a rectangle and four depth pixels 120 are arranged in the four vertices of the rectangle (e.g., the four depth pixels 120 may define the separate, respective vertices of the rectangle). For a repeated UP array, arrays may be developed in such a way that the upper-left depth pixel 120 in FIG. 2A overlaps the lower-right depth pixel 120 of a unit pixel adjacent diagonally to unit pixel UP1. The four polarization pixels 110 may be arranged on the four sides of the rectangle (e.g., may at least partially define separate, respective sides of the four sides of the rectangle), and may include 0°, 45°, 90°, and 135° polarizers 112-1, 112-2, 112-3, and 112-4. However, according to some example embodiments, the four polarization pixels 110 may include two 0° polarizers and two 90° polarizers.

For reference, the unit pixel means a pixel structure of a minimal size, which includes all needed pixels (e.g., at least one depth pixel 120 and at least two polarization pixels 110 having respective polarizers that are associated with different polarization directions), and such unit pixels are repeatedly arranged in the first direction (the x direction or the xy direction (see D1 of FIG. 5)) and the second direction (the y direction or the −xy direction (see D2 of FIG. 5)), thereby implementing an array structure of hundreds of thousands to several millions of total pixels.

Figure 2B:
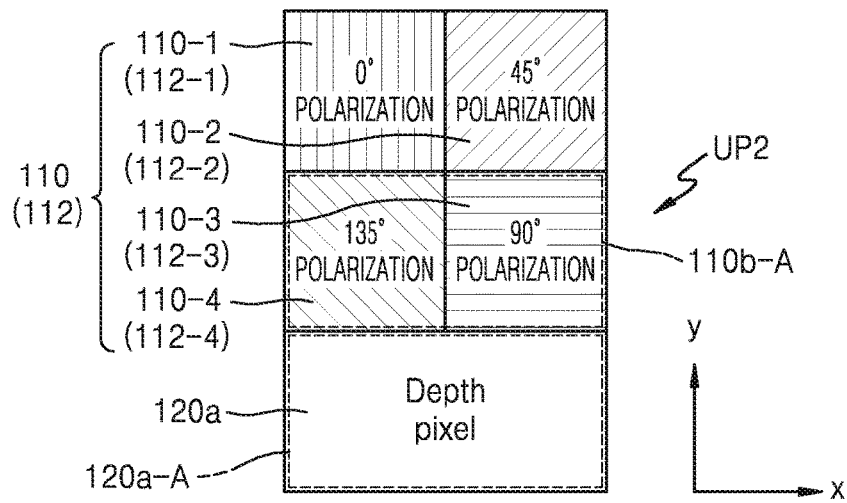

The 3D image sensor 100b-M of FIG. 2B may have a structure in which one depth pixel 120a is coupled to four polarization pixels 110 to collectively define a unit pixel UP2. The depth pixel 120a having a rectangular shape that is long in the first direction (the x direction) may have a size amounting to the two polarization pixels 110 that are directly adjacent to the depth pixel 120a. Restated, and as shown in FIG. 2B, a sensor area 120a-A of the depth pixel 120a may correspond to (e.g., may be the same within a 10% margin) a cumulative sensor area 110b-A of the two polarization pixels 110 that are directly adjacent to the depth pixel 120a. Accordingly, as shown in FIG. 2B, the pixel structure of the unit pixel UP2 may have a second structure including fourth polarization pixels 110 having a 2×2 array structure and one depth pixel 120a, where the one depth pixel 120a has a sensor area 120a-A that corresponds to a cumulative sensor area 110b-A of two polarization pixels 110 of the four polarization pixels 110, and where the one depth pixel 120 is adjacent to the two polarization pixels 110. According to some example embodiments, the depth pixel 120a may have a rectangular shape that is long in the second direction (the y direction).

A unit pixel UP2 of the 3D image sensor 100b-M may include the four polarization pixels 110 and the one depth pixel 120a. The unit pixel UP2 may have a rectangular shape in a 3×2 array structure with respect to the size of the polarization pixel 110. Herein, the 3×2 array structure may mean the rectangular depth pixel 120a long in the first direction (the x direction) is arranged under the four polarization pixels 110 having a 2×2 array structure. According to some example embodiments, the unit pixel UP2 may have a 2×3 array structure including the rectangular depth pixel 120a that is long in the second direction (the y direction).

Figure 2C:
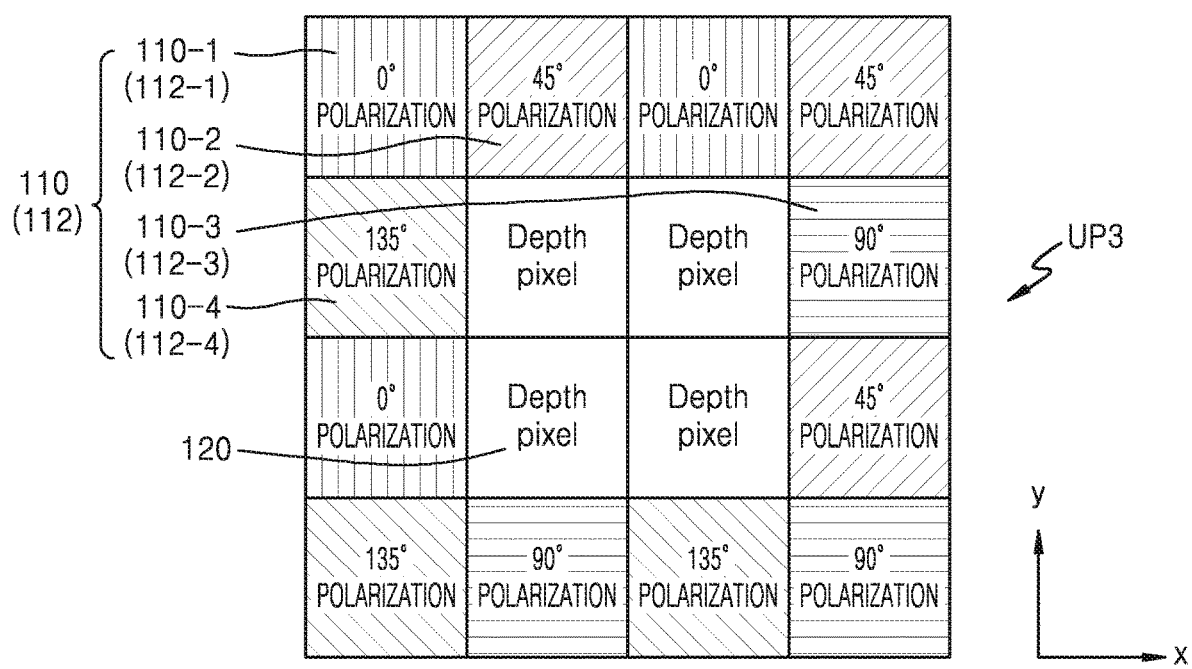

The 3D image sensor 100c-M of FIG. 2C may have a structure in which the twelve polarization pixels 110 surround the four depth pixels 120. A unit pixel UP3 of the 3D image sensor 100c-M may include the twelve polarization pixels 110 and the four depth pixels 120 and have a rectangular shape in a 4×4 array structure. In the unit pixel UP3, the four depth pixels 120 are arranged in a 2×2 array structure in the center of the rectangle, and the twelve polarization pixels 110 are arranged in a periphery of the rectangle to surround the four depth pixels 120. Accordingly, as shown in FIG. 2C, the pixel structure of the unit pixel UP3 may have a third structure including four depth pixels 120 in a center of the third structure of the unit pixel UP3, and twelve polarization pixels 110 in a periphery of the third structure of the unit pixel UP3 and having a 4×4 array structure.

The twelve polarization pixels 110 may include each three of 0°, 45°, 90°, and 135° polarizers 112-1, 112-2, 112-3, and 112-4. The twelve polarization pixels 110 may include a structure in which polarizers having a difference of 45° are arranged alternately in the first direction (the x direction) and in the second direction (the y direction). For example, in the first direction (the x direction), the 0° and 45° polarizers 112-1 and 112-2 are arranged alternately in the upper side of the rectangle, and the 90° and 135° polarizers 112-3 and 112-4 are arranged alternately in the lower side of the rectangle. In the second direction (the y direction), the 0° and 135° polarizers 112-1 and 112-4 are arranged alternately in the left side of the rectangle, and the 45° and 90° polarizers 112-2 and 112-3 are arranged alternately in the right side of the rectangle.

Figure 2D:
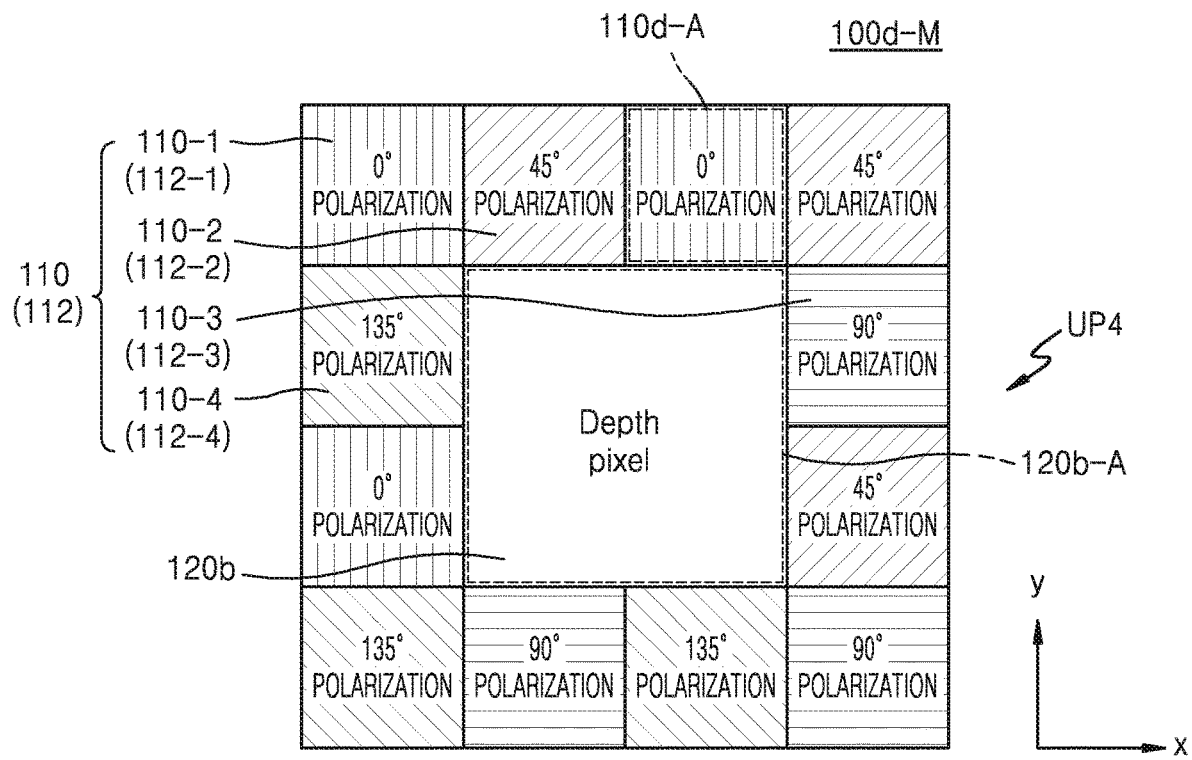

The 3D image sensor 100*d*-M of FIG. 2D may have a structure in which the twelve polarization pixels 110 surround the one depth pixel 120*b*. The depth pixel 120*b* may have a sensor area 120*b*-A amounting to the four polarization pixels 110. Restated, and as shown in FIG. 2D, a sensor area 120*b*-A of the depth pixel 120*b* may correspond to (e.g., may be the same within a 10% margin) a cumulative sensor area 110*d*-A of four polarization pixels 110 of the twelve polarization pixels 110 of the unit pixel UP4. Accordingly, as shown in FIG. 2D, the pixel structure of the unit pixel UP4 may have a fourth structure including twelve polarization pixels 110 in a periphery of the fourth structure, each polarization pixel 110 having a same or substantially same sensor area 120*d*-A (e.g., the same sensor area within manufacturing tolerances and/or material tolerances) and one depth pixel 120, which has an area corresponding to a cumulative area of four polarization pixels 110 of the twelve polarization pixels 112 (e.g., 4 times the sensor area 120*d*-A of each individual polarization pixel 110) and is in a center of the fourth structure. The unit pixel UP3 of the 3D image sensor 100*d*-M may include the twelve polarization pixels 110 and the one depth pixel 120*b*. The unit pixel UP3 may have a rectangular shape in a 4×4 array structure with respect to the size of the polarization pixel 110. The 3D image sensor 100*d*-M of FIG. 2D may correspond to a sensor where the four depth pixels 120 are replaced with the one depth pixel 120*b* in the 3D image sensor 100*c*-M of FIG. 2C.

FIGS. 3A, 3B, 3C, and 3D are conceptual diagrams showing a structure where polarization pixels and time of flight (ToF)-based depth pixels are mixed in 3D image sensors according to some example embodiments of the inventive concepts.

Referring to FIGS. 3A through 3D, 3D image sensors 100*aa*-M, 100*ba*-M, 100*ca*-M, and 100*da*-M according to some example embodiments may have the first coupling structures where the polarization pixel 110 and depth pixels 120T2, 120*a*T2, and 120*b*T4 are mixed, respectively. The 3D image sensors 100*aa*-M, 100*ba*-M, 100*ca*-M, and 100*da*-M according to some example embodiments may basically have a structure corresponding to the 3D image sensors 100*a*-M, 100*b*-M, 100*c*-M, and 100*d*-M of FIGS. 2A through 2D (e.g., the pixel structure of a unit pixel UP defined by at least one depth pixel 120 and at least two polarization pixels 110 of the 3D image sensors may have the first, second, third, or fourth structure as described with reference to FIGS. 2A-2D), but the depth pixels 120T2, 120*a*T2, and 120*b*T4 may be ToF-based depth pixels of the active type. Restated, the depth pixels 120T2, 120*a*T2, and 120*b*T4 may each include a pixel of a ToF-based 3D sensor. As a ToF measurement method, a gate modulation method may be applied to the ToF-based depth pixels 120T2, 120*a*T2, and 120*b*T4. Restated, the depth pixels 120T2, 120*a*T2, and 120*b*T4 may each include a pixel of a ToF-based 3D sensor that is configured to operate according to a gate modulation method. However, the ToF measurement method for application to the depth pixels 120T2, 120*a*T2, and 120*b*T4 is not limited to the gate modulation method. For reference, a ToF-based depth pixel may measure a ToF through a gate modulation method and a direct time measurement method. The gate modulation method irradiates a signal modulated using high-speed gating of an optical modulator to an object and computes a distance by detecting a phase difference between the signal and reflected light coming back from the object, and this method is also called an indirect time measurement method. The direct time measurement method may mean a method of directly measuring a time that is taken for pulse light irradiated to an object to come back after being reflected, by using a timer.

As shown in FIGS. 3A-3D, and with further reference to FIGS. 12A-13B, an image sensor 100 may include a unit pixel, where the unit pixel includes a charge generation region 122 in a substrate 101, and at least two polarizers 112 on the substrate 101 in a light-incident direction 1201, where at least two polarizers are associated with different polarization directions, where the 3D image sensor is configured to generate depth information associated with a depth of an object from the 3D image sensor in a 3D scene based on detecting light reflected from the object and shape information associated with a shape of a surface of the object in the 3D scene based on detecting light reflected from the object.

Figure 3A:
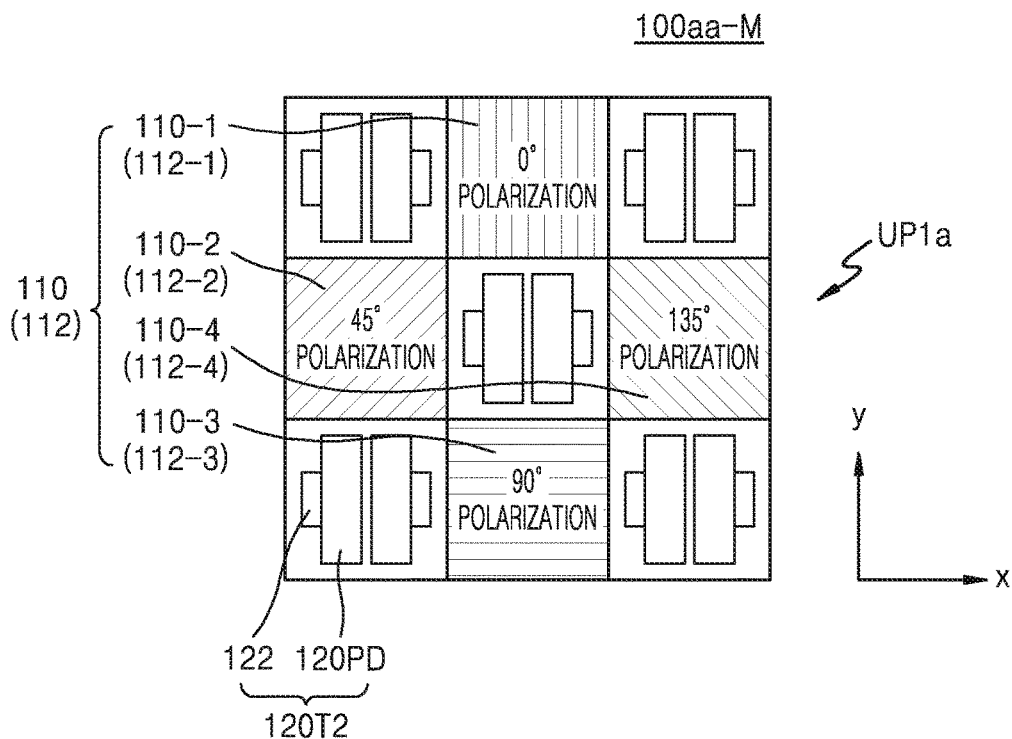
FIGS. 3A, 3B, 3C, and 3D are conceptual diagrams showing a structure where polarization pixels and time of flight (ToF)-based depth pixels are combined in 3D image sensors according to some example embodiments of the inventive concepts.

More specifically, a unit pixel UP1*a* of the 3D image sensor 100*aa*-M of FIG. 3A may include four polarization pixels 110 and four ToF-based depth pixels 120T2, which are arranged alternately. The depth pixel 120T2 may have a 2-tap pixel structure. However, the tap structure of the depth pixel 120T2 is not limited to the 2-tap pixel structure. For example, according to some example embodiments, the depth pixel 120T2 may have a 1-tap pixel structure or a 4-tap pixel structure.

In FIG. 3A, which illustrates a unit pixel UP1*a* having a pixel structure that has the first structure as described with reference to FIG. 2A, two long rectangles in the center of the depth pixel 120T2 mean charge generation regions 120PD, and protruding parts of the charge generation regions 120PD mean charge storage regions 122. In the depth pixel 120T2 of the 3D image sensor 100*aa*-M according to some example embodiments, the charge generation regions 120PD may be implemented with photogates and/or photodiodes. The charge storage regions 122 may be implemented with floating diffusion (FD) regions and/or separate charge storage structures such as storage gates or storage diodes. As shown in FIG. 3A, each depth pixel 120 of the first structure shown in FIG. 3A may have a 2-tap pixel structure.

For reference, a tap structure of a ToF-based depth pixel may be determined depending on the number of taps capable of delivering electric charges generated in the charge generation region such as a photodiode or a photogate to the charge storage region, separately for each phase. As representative examples, the tap structure may be classified into a 1-tap structure, the 2-tap structure, and the 4-tap structure. Each tap may correspond to a separate charge storage region 122 of the depth pixel 120. For example, a depth pixel 120 having 1 charge storage region 122 may have a 1-tap pixel structure, a depth pixel 120 having 2 charge storage regions 122 as shown in at least FIGS. 3A-3C may have a 2-tap pixel structure, and a depth pixel 120 having 4 charge storage regions as shown in at least FIG. 3D may have a 4-tap pixel structure. The 1-tap structure transmits the charges for each phase of 0°, 90°, 180°, and 270° by using one tap; the 2-tap structure transmits the charges for the 0° and 180° phases and for the 90° and 270° phases, by using two taps; and the 4-tap structure transmits the charges for all of the phases by using four taps. The 1-tap structure needs four sampling times for the respective phases, the 2-tap structure needs two sampling times, and the 4-tap structure needs one sampling time. Thus, the 2-tap structure and the 4-tap structure may operate at high speed compared to the 1-tap structure.

Meanwhile, a function of a tap may be executed by a photogate and/or a tap gate. For example, the photogate may function as a tap that directly delivers the electric charges to the charge storage region while generating the electric charges. In this case, a tap structure may be determined by the number of photogates. According to some example embodiments, a photodiode in place of a photogate may be arranged, and a tap gate that delivers the electric charges generated in the photodiode to the charge storage region may be separately arranged. In this case, a tap structure may be determined by the number of tap gates.

Figure 3B:
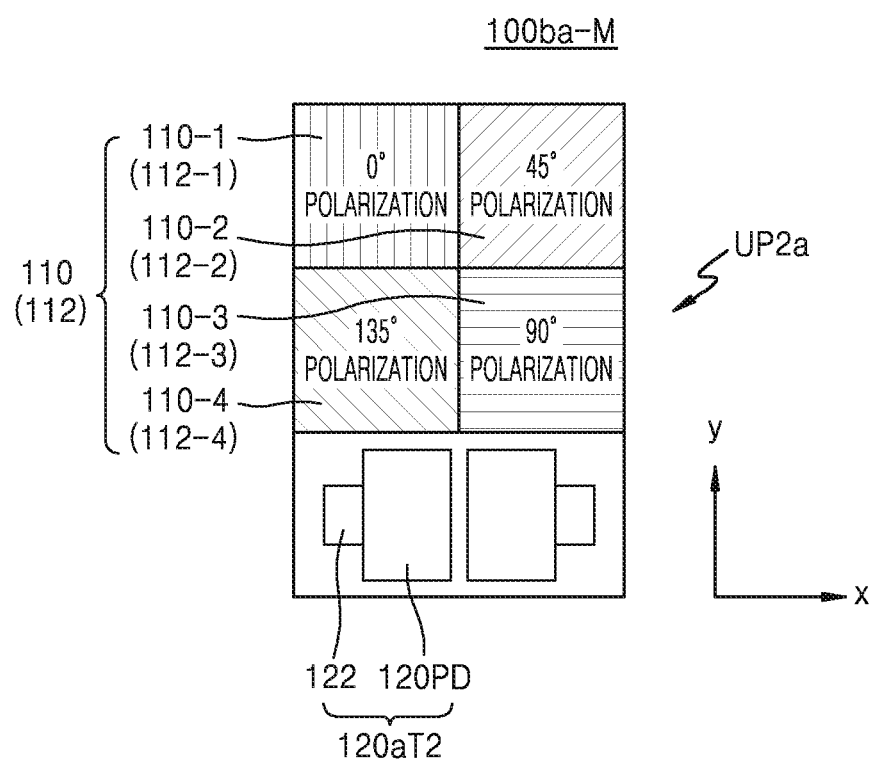

A unit pixel UP2a of the 3D image sensor 100ba-M of FIG. 3B, which illustrates a unit pixel UP2a having a pixel structure that has the second structure as described with reference to FIG. 2B, may have a rectangular shape in a 3×2 array structure and include four polarization pixels 110 and one ToF-based depth pixel 120aT2. The depth pixel 120aT2 may have a size that is twice larger than that of the polarization pixel 110 and have a rectangular structure that is long in the first direction (the x direction). As shown in FIG. 3B, each depth pixel 120aT2 may have a 2-tap pixel structure. However, the tap structure of the depth pixel 120aT2 is not limited to the 2-tap pixel structure.

Figure 3C:
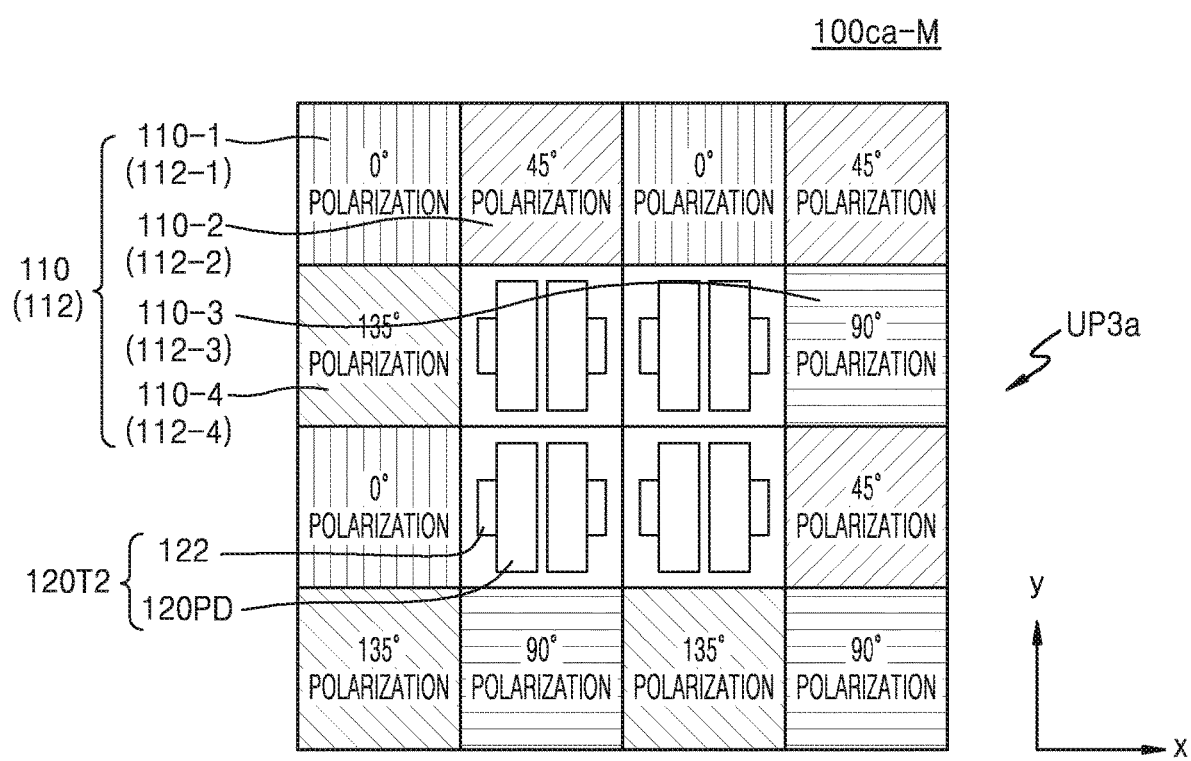

A unit pixel UP3a of the 3D image sensor 100ca-M of FIG. 3C, which illustrates a unit pixel UP3a having a pixel structure that has the third structure as described with reference to FIG. 2C, may have a rectangular shape in a 4×4 array structure and include twelve polarization pixels 110 and four ToF-based depth pixels 120T2. The four depth pixels 120T2 are arranged in a 2×2 array structure in the center of the rectangle, and the twelve polarization pixels 110 are arranged in a periphery of the rectangle to surround the four depth pixels 120T2. As shown in FIG. 3C, each depth pixel 120T2 may have, but not limited to, the 2-tap pixel structure.

Figure 3D:
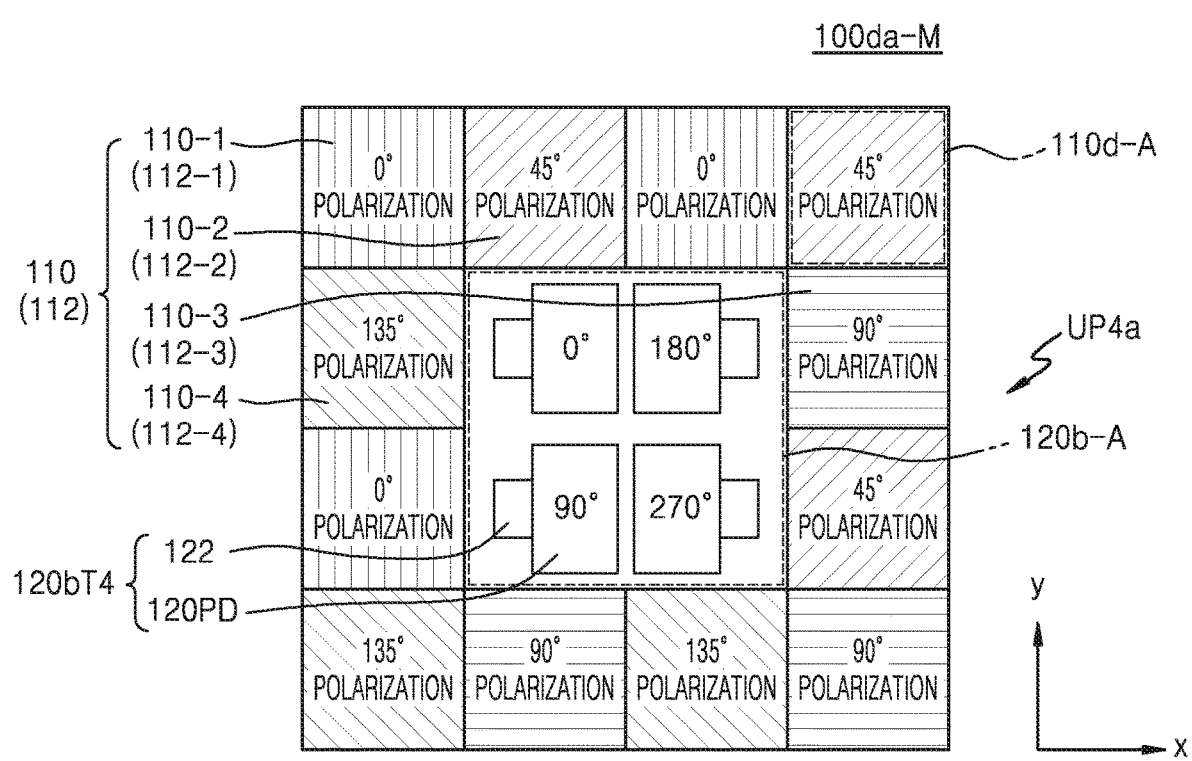

A unit pixel UP4a of the 3D image sensor 100da-M of FIG. 3D, which illustrates a unit pixel UP4a having a pixel structure that has the fourth structure as described with reference to FIG. 2D, may have a rectangular shape in a 4×4 array structure and include twelve polarization pixels 110 and one ToF-based depth pixel 120bT4. The one depth pixel 120bT4 having a sensor area 120b-A amounting to the four polarization pixels 110 (e.g., corresponding to a cumulative sensor area (4×110d-A) of the sensor areas 110d-A of four polarization pixels 110) may be arranged in the center of the rectangle, and the twelve polarization pixels 110 may be arranged in a periphery of the rectangle to surround the one depth pixel 120bT4. As shown in FIG. 3D, each depth pixel 120bT4 may have, but not limited to, the 4-tap pixel structure. For example, according to some example embodiments, the depth pixel 120bT4 may have the 1-tap pixel structure or the 2-tap pixel structure.

In FIG. 3D, 0°, 90°, 180°, and 270° indicated on the four charge generation regions 120PD of the depth pixel 120bT4 mean that the four charge generation regions 120PD correspond to the phases of 0°, 90°, 180°, and 270°. Meanwhile, in FIGS. 3A through 3C, the depth pixels 120T and 120aT2 have 2-tap pixel structures, such that the two charge generation regions 120PD may correspond to 0° and 180° or 90° and 270°.

Figure 4A:
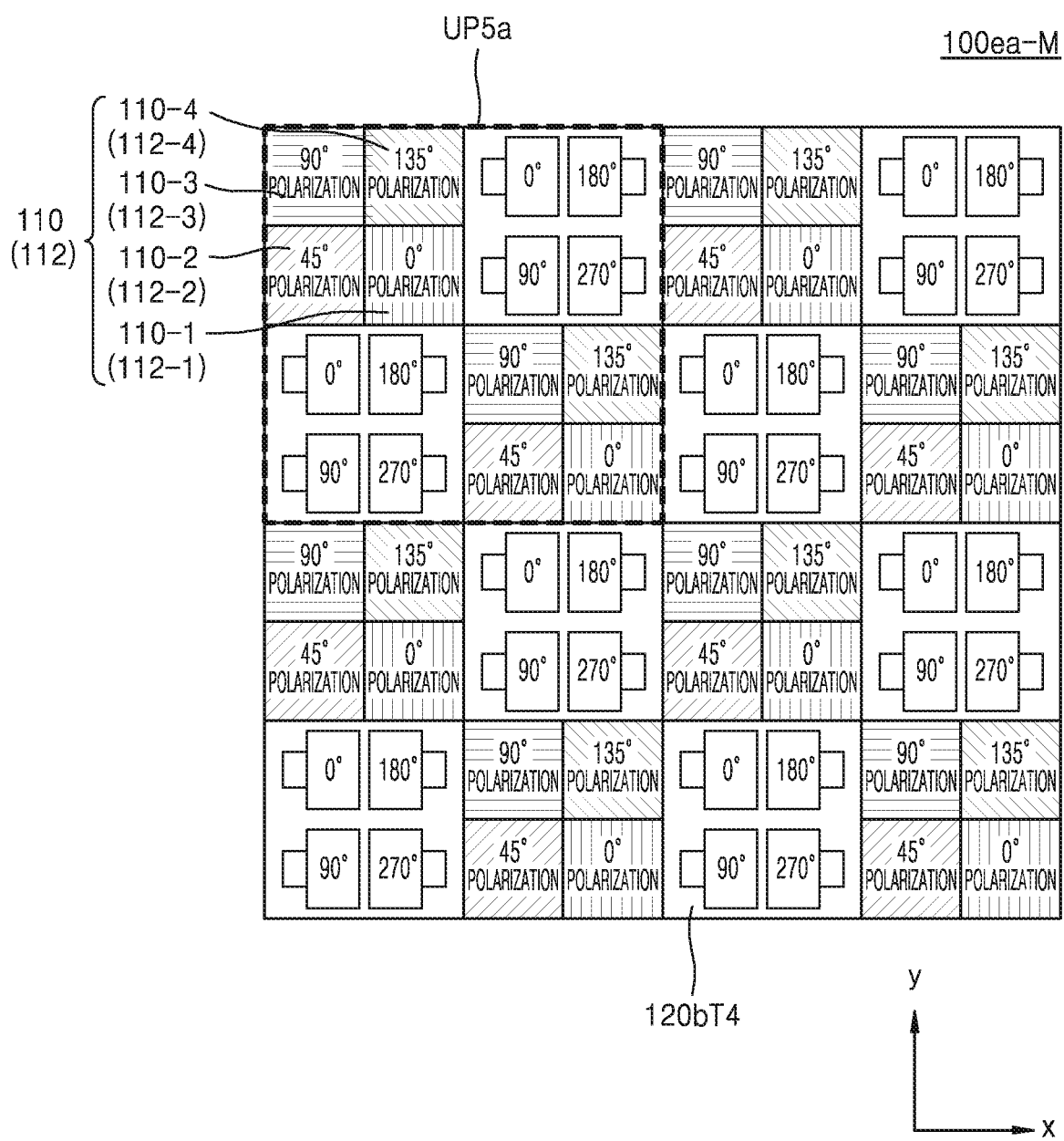
FIGS. 4A, 4B, and 4C are conceptual diagrams showing relative densities of polarization pixels and depth pixels in 3D image sensors according to some example embodiments of the inventive concepts.
Figure 4B:
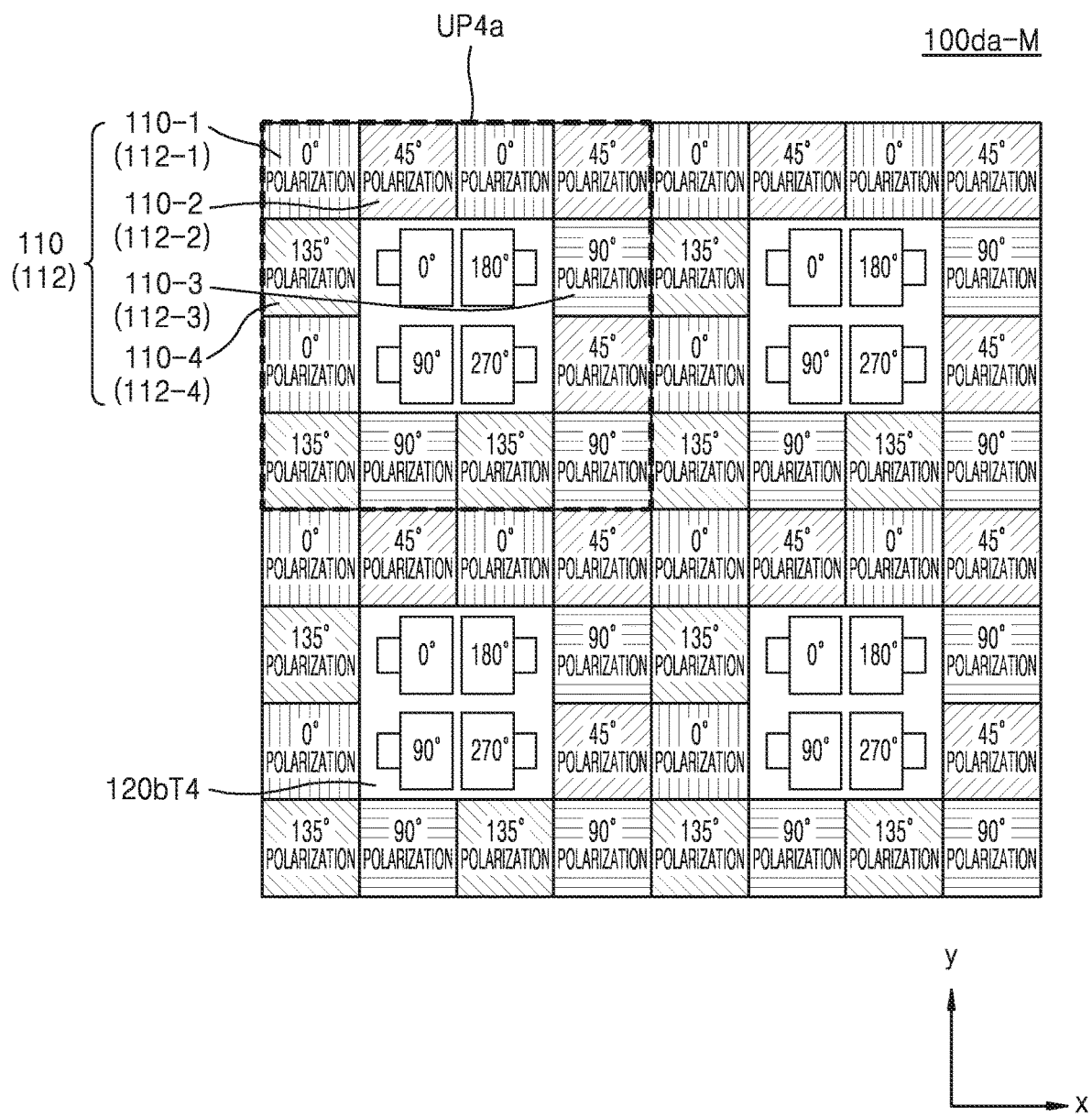
Figure 4C:
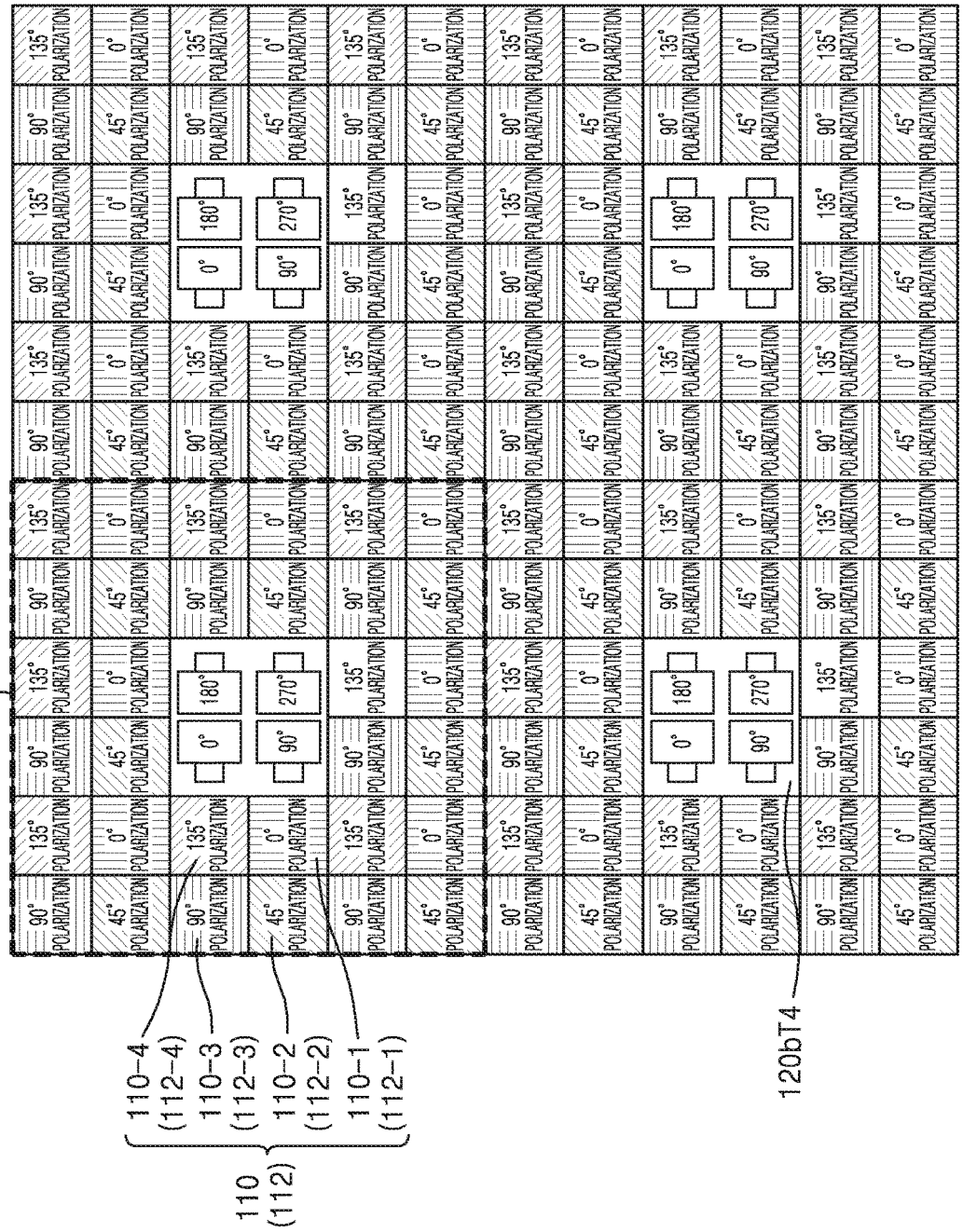

FIGS. 4A, 4B, and 4C are conceptual diagrams showing relative densities of polarization pixels and depth pixels in 3D image sensors according to some example embodiments of the inventive concepts. As shown in FIGS. 4A-4C, a unit pixel may have a density structure that is one of a first density structure, a second density structure, or a third density structure, but example embodiments are not limited thereto.

Referring to FIG. 4A, in a 3D image sensor 100ea-M according to some example embodiments, a unit pixel UP5a may include the eight polarization pixels 110 and the two ToF-based depth pixel 120bT4. The depth pixel 120bT4 may have a size (sensor area) amounting to the four polarization pixels 110 (corresponding to the cumulative sensor area of the four polarization pixels 110). The depth pixel 120bT4 may have, but not limited to, the 4-tap pixel structure.

The 3D image sensor 100ea-M according to some example embodiments may have a checker board form where the four polarization pixels 110 in a 2×2 array structure and the one depth pixel 120bT4 are arranged alternately in the first direction (the x direction) and the second direction (the y direction). The 3D image sensor 100ea-M according to some example embodiments may have a one-to-one density relationship between the polarization pixel 110 and the depth pixel 120bT4, in size terms. Accordingly, the unit pixel UP5a may be understood to have a density structure that is a first density structure that includes two depth pixels 120 and eight polarization pixels 110.

Referring to FIG. 4B, in the 3D image sensor 100da-M according to some example embodiments, the unit pixel UP4a may include the twelve polarization pixels 110 and the one ToF-based depth pixel 120bT4 and may correspond to the unit pixel UP4a shown in FIG. 3D, such that the depth pixel 120bT4 may have a size (sensor area) amounting to the four polarization pixels 110 (corresponding to the cumulative sensor area of the four polarization pixels 110). In addition, the 3D image sensor 100ea-M according to some example embodiments may have a three-to-one density relationship between the polarization pixel 110 and the depth pixel 120bT4, in size terms. Accordingly, the unit pixel UP4a may be understood to have a density structure that is a second density structure that includes one depth pixel 120 and twelve polarization pixels 110.

Referring to FIG. 4C, in a 3D image sensor 100fa-M according to some example embodiments, a unit pixel UP6a may include the thirty-two polarization pixels 110 and the one ToF-based depth pixel 120bT4, such that the depth pixel 120bT4 may have a size (sensor area) amounting to the four polarization pixels 110 (corresponding to the cumulative sensor area of the four polarization pixels 110). The depth pixel 120bT4 may have, but not limited to, the 4-tap pixel structure. The unit pixel UP6a may have a structure where eight groups, each including the four polarization pixels 110 in the 2×2 array structure, surround the one depth pixel 120bT4. The 3D image sensor 100fa-M according to some example embodiments may have an eight-to-one density relationship between the polarization pixel 110 and the depth pixel 120bT4, in size terms. Accordingly, the unit pixel UP6a may be understood to have a density structure that is a third density structure that includes one depth pixel 120 and thirty-two polarization pixels 110.

While several embodiments have been described regarding a density relationship between the polarization pixels 110 and the depth pixel 120bT4 with reference to FIGS. 4A through 4C, the density relationship between the polarization pixels 110 and the depth pixel 120bT4 is not limited thereto. For example, according to some example embodiments, the polarization pixels 110 and the depth pixel 120bT4 may be arranged with more various density relationships.

Meanwhile, when the size of the ToF-based depth pixel 120bT4 is larger than that of the polarization pixel 110, two or four or more polarization pixels 110 are arranged per depth pixel 120bT4, thereby accurately measuring the 3D shape of the object. For example, more polarization pixels 110 are arranged than the depth pixel 120bT4, such that a depth image by a depth pixel may have a relatively low resolution, but a polarization image by a polarization pixel may have a relatively high resolution. However, by combining the depth image with the polarization image, a high-resolution 3D image may be implemented which accurately reflects the shape of the surface of the object.

Figure 5:
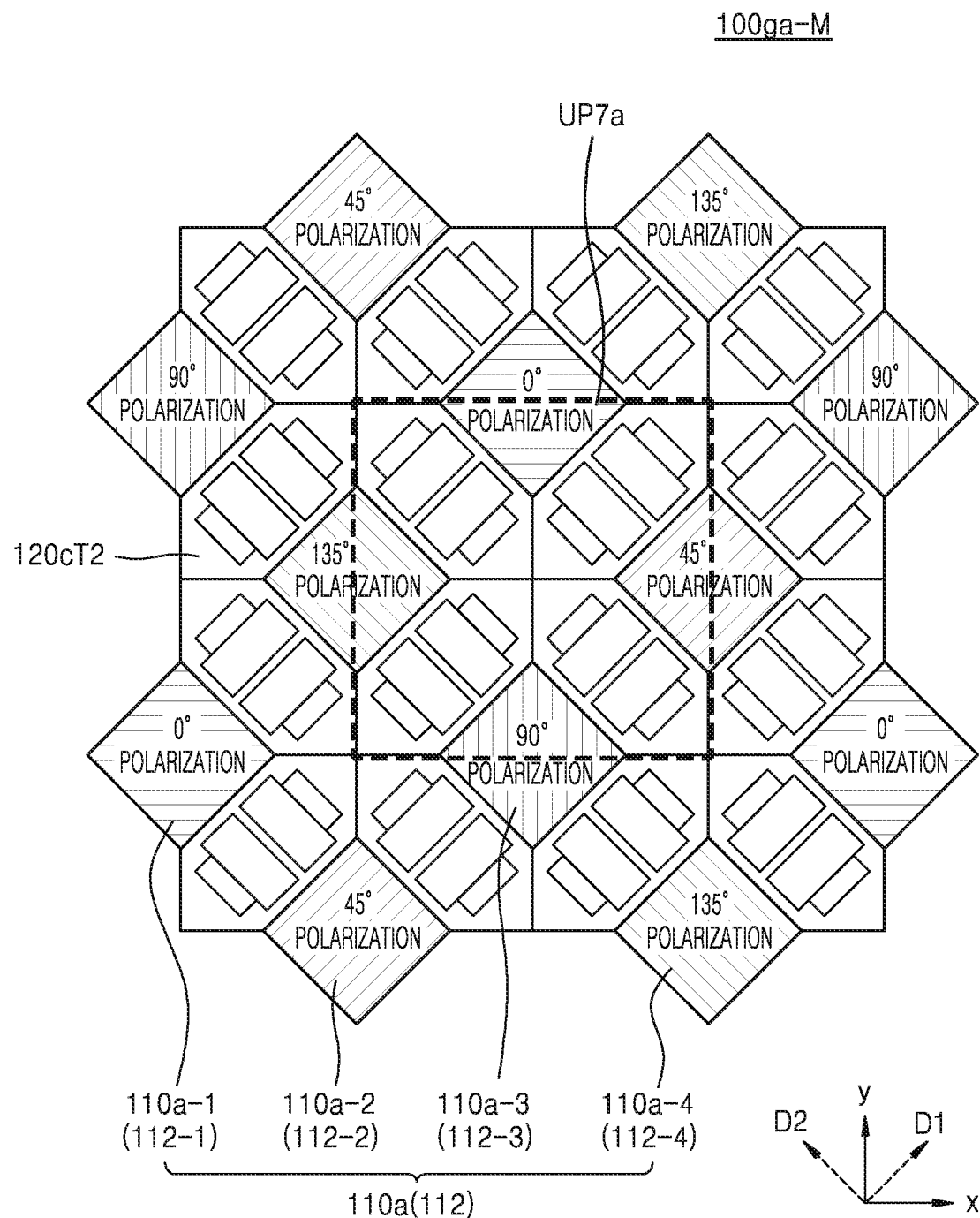
FIG. 5 is a conceptual diagram showing a structure where polarization pixels and ToF-based depth pixels are combined in a 3D image sensor according to some example embodiments of the inventive concepts.

FIG. 5 is a conceptual diagram showing a structure where polarization pixels and ToF-based depth pixels are mixed in a 3D image sensor according to some example embodiments of the inventive concepts.

Referring to FIG. 5, in a 3D image sensor 100ga-M of the current embodiment, polarization pixels 110a (e.g., 110a-1 to 110a-4) and ToF-based depth pixels 120cT2 may be arranged alternately in two diagonal directions D1 and D2 between the first direction (the x direction) and the second direction (the y direction). The ToF-based depth pixel 120cT2 may have, but not limited to, the 2-tap pixel structure.

A unit pixel UP7a of the 3D image sensor 100ga-M according to some example embodiments may include the two polarization pixels 110a and the four depth pixels 120cT2, and may have the rectangular structure. Inside the rectangle, each two of the four depth pixels 120cT2 may be arranged in the diagonal directions D1 and D2, such that the unit pixel UP7a has a structure in which the four depth pixels 120cT2 define separate, respective vertices of a rectangle, as shown in at least FIG. 5. The four polarization pixels 110a may be arranged in the four sides of the rectangle, such that a diagonal of each polarization pixel 110a is aligned with a separate side of the four sides of the rectangle and one-half of the area of each polarization pixel 110a is within the rectangle and one-half of the area of each polarization pixel 110a is outside the rectangle, as shown in at least FIG. 5. Each of the four polarization pixels 110a is shared by two adjacent unit pixels UP7a, such that the two polarization pixels 110a may be allocated to one unit pixel UP7a. Restated, a given unit pixel UP7a may be understood to include two polarization pixels 110a that are collectively defined by the one-half areas of the four polarization pixels 110a that are within the rectangle of the unit pixel UP7a. As shown in at least FIG. 5, the plurality of unit pixels UP7a may define an alternating pattern of depth pixels 120cT2 and polarization pixels 110a in two diagonal directions D1 and D2, wherein each diagonal direction of the two diagonal directions extends along a different diagonal of the rectangle of a given unit pixel UP7a.

When the polarization pixel 110a and the depth pixel 120cT2 have substantially the same size ("sensor area") in the 3D image sensor 100ga-M according to some example embodiments, the polarization pixel 110a and the depth pixels 120cT2 may have a one-to-two density relationship, in size terms. Meanwhile, in the 3D image sensor 100ga-M according to some example embodiments, the polarizer 112 is arranged such that four polarizers 112-1, 112-2, 112-3, and 112-4 of four polarization directions all are included in the unit pixel UP7a, but polarizers having a phase difference of 90° may be alternately arranged in the first direction (the x direction) and the second direction (the y direction).

Figure 6A:
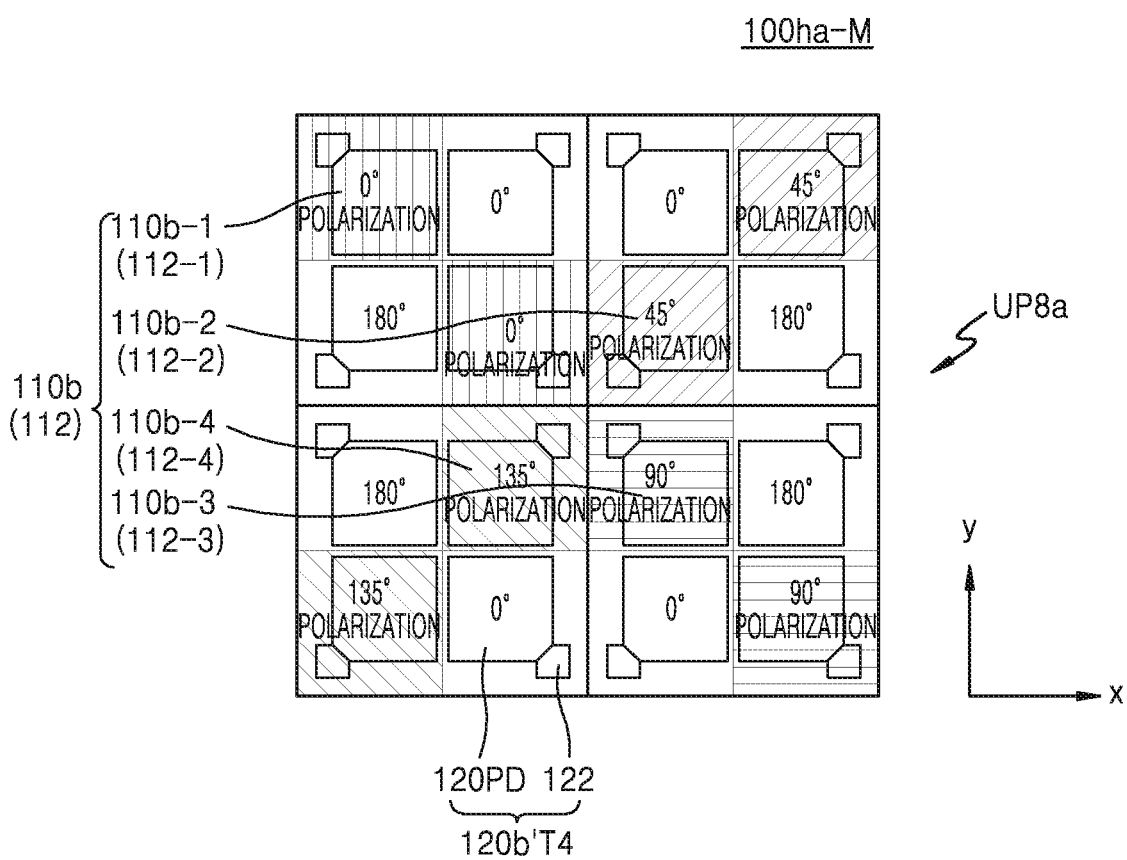
FIGS. 6A and 6B are conceptual diagrams showing a structure where polarization pixels and ToF-based depth pixels are combined in 3D image sensors according to some example embodiments of the inventive concepts.
Figure 6B:
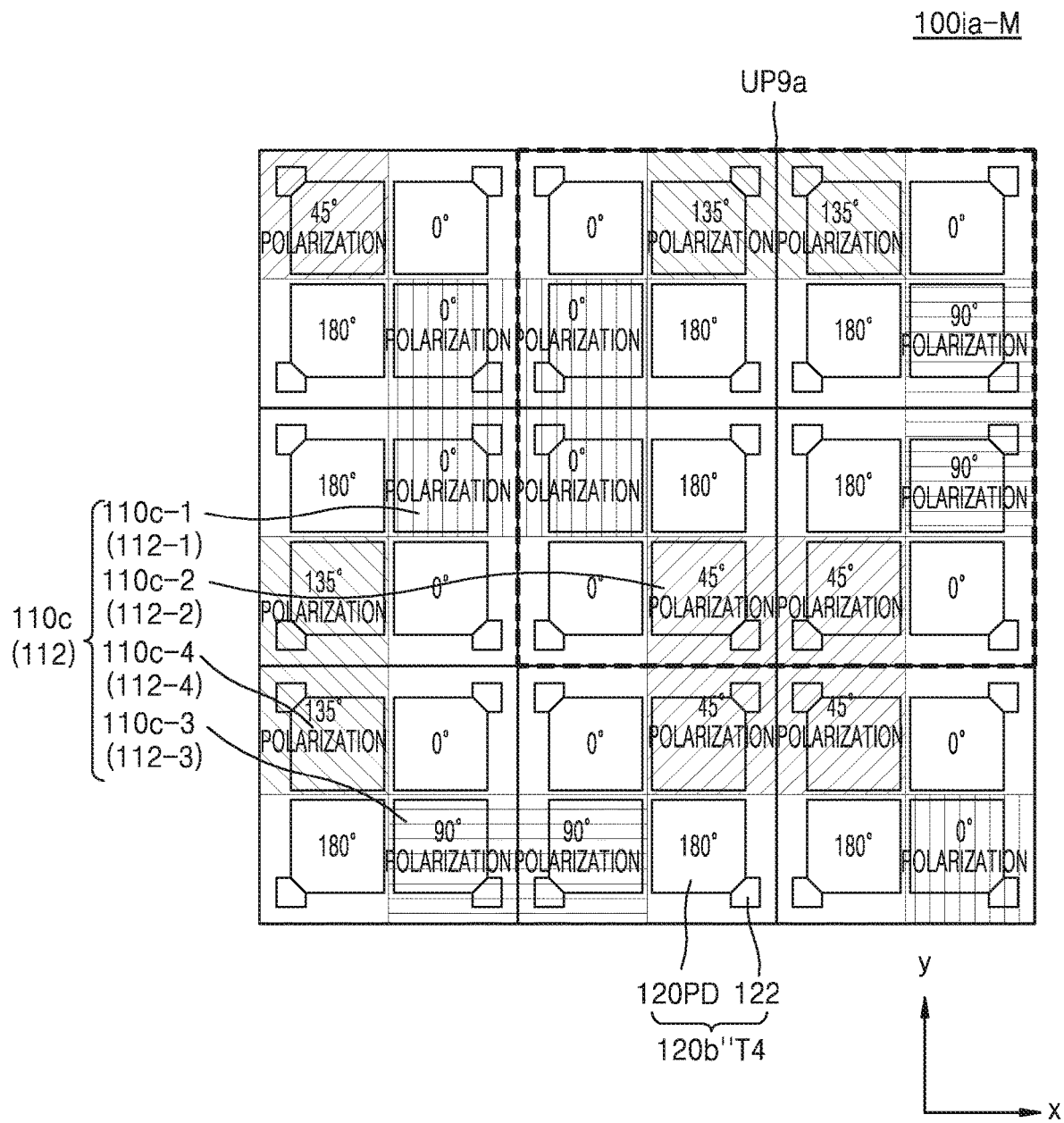

FIGS. 6A and 6B are conceptual diagrams showing a structure where polarization pixels and ToF-based depth pixels are mixed in 3D image sensors according to some example embodiments of the inventive concepts.

Referring to FIG. 6A, a 3D image sensor 100ha-M having a unit pixel UP8a according to some example embodiments may be different from the 3D image sensors 100aa-M through 100ga-M which each include the ToF-based depth pixel and have the first coupling structure in a sense that a polarization pixel 110b is formed using a part of a ToF-based depth pixel 120b'T4. More specifically, in the 3D image sensor 100ha-M according to some example embodiments, the depth pixel 120b'T4 may have the 4-tap pixel structure including the four charge generation regions 120PD. The polarizers 112 (e.g., 112-1 to 112-4) are arranged on the two charge generation regions 120PD among the four charge generation regions 120PD, e.g., the charge generation regions 120PD corresponding to 90° and 270°, for use in polarization pixels 110b (e.g., 110b-1 to 110b-4).

In the 3D image sensor 100ha-M according to some example embodiments, the depth pixel 120b'T4 physically corresponds to the 4-tap pixel structure where the four charge generation regions 120PD are formed in one pixel, but may functionally correspond to the 2-tap pixel structure because two of the charge generation regions 120PD are used for the polarization pixels 110b. Thus, the depth pixel 120b'T4 operates to perform sampling twice for the 0° and 180° phases and for the 90° and 270° phases, and sensing by polarization may be performed between phase-specific sampling operations. Although the charge generation region 120PD used in the polarization pixel 110b is a part of the depth pixel 120b'T4, the charge generation region 120PD is not used for depth measurement and thus may functionally correspond to a normal pixel. Consequently, the polarization pixel 110b may not deviate from the concept of the polarization pixel described with reference to FIG. 1. Accordingly, the depth pixel 120b'T4 may have a 4-tap pixel structure, and the 4-tap pixel structure may include includes the polarizer 112 in two tap portions associated with the polarization pixel 110 and the depth pixel 120 in another two tap portions.

In FIG. 6A, the charge generation regions 120PD corresponding to the 0° and 180° phases and the corresponding charge storage regions 122 are arranged diagonally. However, without being limited to this example, like in the structure of the 3D image sensor 100da-M of FIG. 3D, the charge generation regions 120PD and the charge storage regions 122 may be arranged and two upper or lower charge generation regions 120PD may be used for the polarization pixel 110b.

In the 3D image sensor 100ha-M according to some example embodiments, two polarizers 112 having the same polarization direction are used in one depth pixel 120*b'*T4, thus implementing two polarization pixels 110*b*. For example, two 0° polarizers 112 may be arranged on the two charge generation regions 120PD of the upper left depth pixel 120*b'*T4. In the 3D image sensor 100*ha*-M, a deep trench isolation (DTI) structure may be formed between the depth pixels 120*b'*T4, thus minimizing an influence of light incident to the nearby depth pixels 120*b'*T4. Restated, a boundary of a depth pixel 120*b'*T4 may at least partially define a deep trench isolation (DTI) structure Thus, when the polarizers 112 having the same polarization direction are arranged in one depth pixel 120*b'*T4, detection of polarization information may be performed stably. Accordingly, as shown in FIG. 6A, the 4-tap pixel structure of the depth pixel 120*b'*T4 may include two polarizers 112 having a same polarization direction, or two polarizers 112 having two different polarization directions.

Referring to FIG. 6B, a 3D image sensor 100*ia*-M according to some example embodiments may be similar with the 3D image sensor 100*ha*-M of FIG. 6A in a sense that a polarization pixel 100*c* is formed using a part of the ToF-based depth pixel 120*b'*T4. However, the 3D image sensor 100*ia*-M according to some example embodiments may be different from the 3D image sensor 100*ha*-M of FIG. 6A in a sense that in the 3D image sensor 100*ia*-M, polarizers 112 (e.g., 112-1 to 112-4) having two different polarization directions are used in one depth pixel 120*b'*T4, thus implementing two polarization pixels 110*c*. For example, the 0° polarizer 112-1 and the 45° polarizer 112-2 may be applied to the topmost left depth pixel 120*b'*T4.

Meanwhile, as shown in FIG. 6B, one polarizer 112 having the same polarization direction may be arranged across four depth pixels 120*b"*T4. For example, the 0° polarizer 112-1 may be arranged across the depth pixels 120*b"*T4 in the upper left part, the upper middle part, the middle upper part, and the middle part. Such a structure may be slightly unstable in terms of detection of polarization information because the two polarizers 112 are arranged in the one depth pixel 120*b'*T4 and thus different pieces of polarization information are detected. However, the polarizer 112 is arranged with substantially the same size as the depth pixel 120*b"*T4, resulting in a relatively low difficulty in a manufacturing process. Meanwhile, a unit pixel UP9*a* of the 3D image sensor 100*ia*-M may include the eight polarization pixels 110*c* (e.g., 110*c*-1 to 110*c*-4) and the four depth pixels 120*b"*T4.

FIGS. 7A, 7B, 7C, and 7D are conceptual diagrams showing a structure where polarization pixels and multi-photodiode (multi-PD)-based depth pixels are mixed in 3D image sensors according to some example embodiments of the inventive concepts.

Referring to FIGS. 7A through 7D, 3D image sensors 100*ap*-M, 100*bp*-M, 100*cp*-M, and 100*dp*-M according to some example embodiments each may have the first coupling structure where the polarization pixel 110 and depth pixels 120P2, 120*a*P2, and 120*b*P4 are mixed, respectively. The 3D image sensors 100*ap*-M, 100*bp*-M, 100*cp*-M, and 100*dp*-M according to some example embodiments may basically have a structure respectively corresponding to the 3D image sensors 100*a*-M, 100*b*-M, 100*c*-M, and 100*d*-M of FIGS. 2A through 2D, but the depth pixels 120P2, 120*a*P2, and 120*b*P4 may be multi-PD-based depth pixels of the passive type (e.g., pixels of a multi-photodiode (PD)-based 3D sensor), and a microlens 130 may be arranged on the depth pixels 120P2, 120*a*P2, and 120*b*P4. The depth-pixels 120P2, 120*a*P2, and 120*b*P4 may have a pixel structure that is a 2PD pixel structure, a 4PD pixel structure, or a super-PD pixel structure. In view of at least the above, the 3D image sensors 100*ap*-M, 100*bp*-M, 100*cp*-M, and 100*dp*-M may each be a multi-photodiode (PD)-based 3D sensor that includes a microlens 130 on the polarizer 112, and the unit pixel(s) of the 3D image sensors 100*ap*-M, 100*bp*-M, 100*cp*-M, and 100*dp*-M may have a pixel structure that is a 2PD pixel structure, a 4PD pixel structure, or a super PD pixel structure.

Figure 7A:
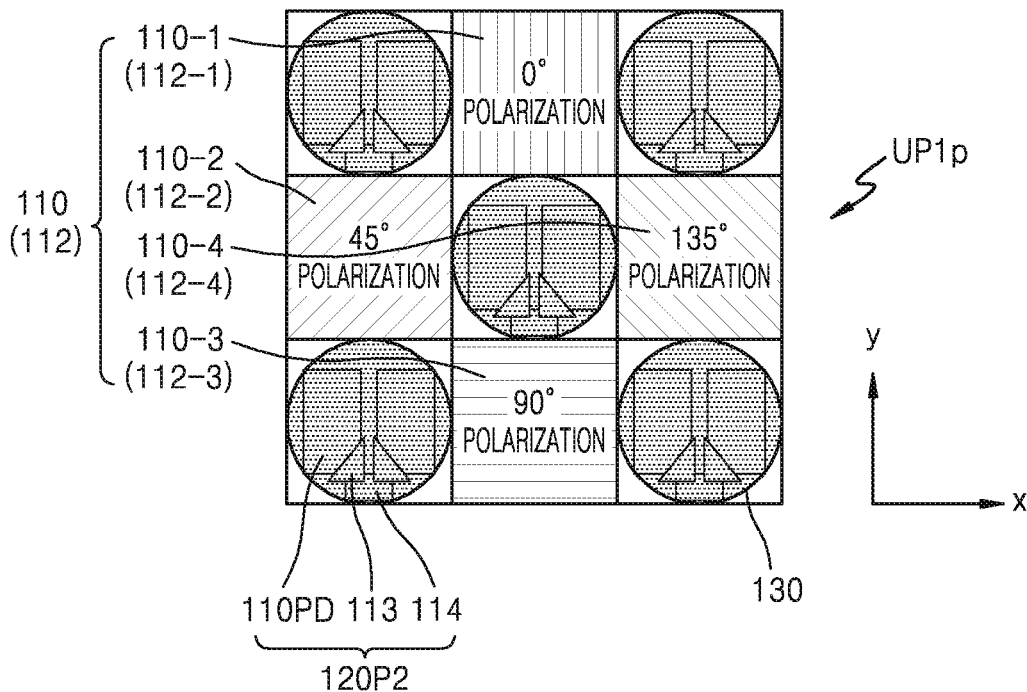
FIGS. 7A, 7B, 7C, and 7D are conceptual diagrams showing a structure where polarization pixels and multi-photodiode (multi-PD)-based depth pixels are combined in 3D image sensors according to some example embodiments of the inventive concepts.

More specifically, a unit pixel UP1*p* of the 3D image sensor 100*ap*-M of FIG. 7A may include four polarization pixels 110 and four multi-PD-based depth pixels 120P2 which are arranged alternately. The microlens 130 may be arranged on each of the five depth pixels 120P2 shown in FIG. 7A. As shown in FIGS. 7A-7D, the microlens 130 may be on the substrate 101 of the depth pixel 120P2, 120*a*P2, 120*b*P4 in a light-incident direction 1201. Meanwhile, the depth pixel 120P2 may have a 2PD pixel structure. However, the pixel structure of the depth pixel 120P2 is not limited to the 2PD pixel structure. For example, according to some example embodiments, the depth pixel 120P2 may have a 4PD pixel structure or a super-PD pixel structure.

In FIG. 7A, which illustrates a unit pixel UP1*p* having a pixel structure that has the first structure as described with reference to FIG. 2A, two long rectangles in the center of the depth pixel 120P2 means photodiodes 110PD, a triangle at a vertex of the photodiode 110PD means a transfer gate 113, and a part protruding downward means an FD region 114. As shown in FIG. 7A, the depth pixel 120P2 may have a structure in which two photodiodes 110PD share one FD region 114. However, according to some example embodiments, the depth pixel 120P2 may have a no-shared structure in which the FD region 114 is arranged on each of the two photodiodes 110PD.

For reference, the pixel structure of the multi-PD-based depth pixel may be determined according to the number of photodiodes arranged in the pixel. For example, the pixel structure of the multi-PD-based depth pixel may be classified into a 2PD pixel structure where two photodiodes are arranged in the pixel and a 4PD pixel structure where four photodiodes are arranged in the pixel. Meanwhile, one microlens is generally arranged in one pixel, but when one microlens is arranged across two or more pixels, the pixel structure may be classified as a super-PD pixel structure regardless of the number of photodiodes. The multi-PD-based depth pixel may detect depth information of an object by using a principle that a focusing position of light incident through a microlens differs with a depth of the object. This principle may be similar with a principle in which a general image sensor performs auto-focusing using two photo-diodes.

Figure 7B:
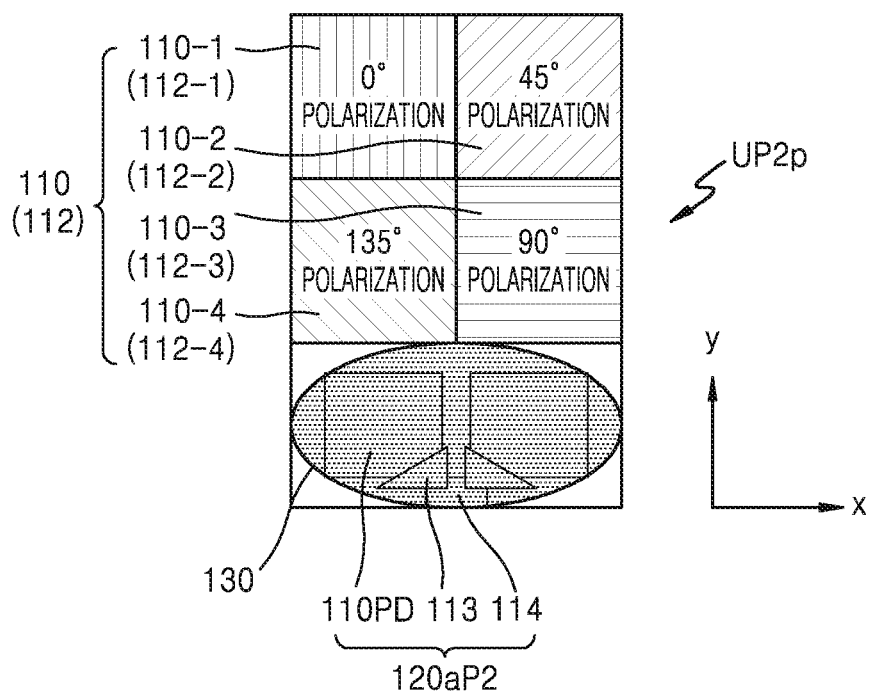

A unit pixel UP2*p* of the 3D image sensor 100*bp*-M of FIG. 7B, which illustrates a unit pixel UP2*p* having a pixel structure that has the second structure as described with reference to FIG. 2B, may have a rectangular shape in a 3×2 array structure and include four polarization pixels 110 and one multi-PD-based depth pixel 120*a*P2. The corresponding microlens 130 may be arranged on the depth pixel 120*a*P2. The depth pixel 120*a*P2 may have a size that is twice larger than that of the polarization pixel 110 and have a rectangular structure that is long in the first direction (the x direction). The depth pixel 120*a*P2 may have, but not limited to, the 2PD pixel structure.

Figure 7C:
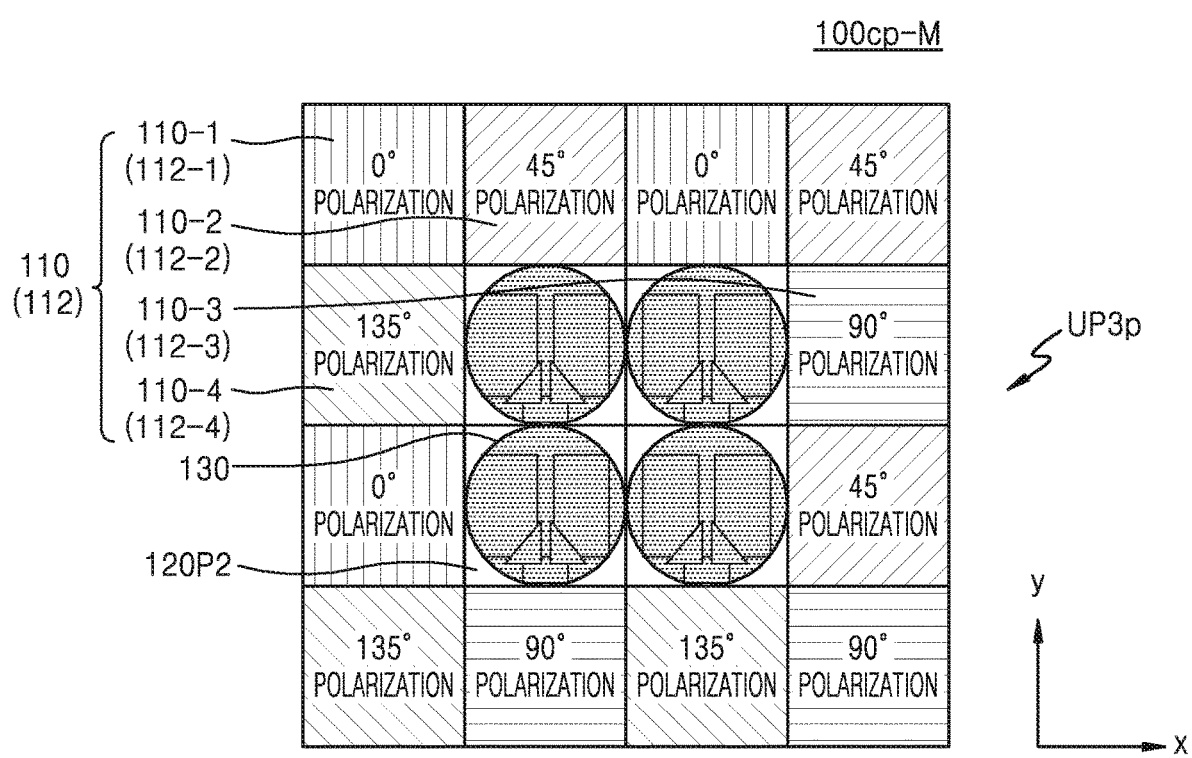

A unit pixel UP3*p* of the 3D image sensor 100*cp*-M of FIG. 7C, which illustrates a unit pixel UP3*pa* having a pixel structure that has the third structure as described with reference to FIG. 2C, may have a rectangular shape in a 4×4 array structure and include the twelve polarization pixels 110 and the four multi-PD-based depth pixels 120P2. The corresponding microlens 130 may be arranged on the depth pixel 120P2. The depth pixel 120P2 may have, but not limited to, the 2PD pixel structure. Meanwhile, the depth pixel 120P2 may have a structure where two depth pixels 120P2 in the 2PD pixel structure share one FD region.

Figure 7D:
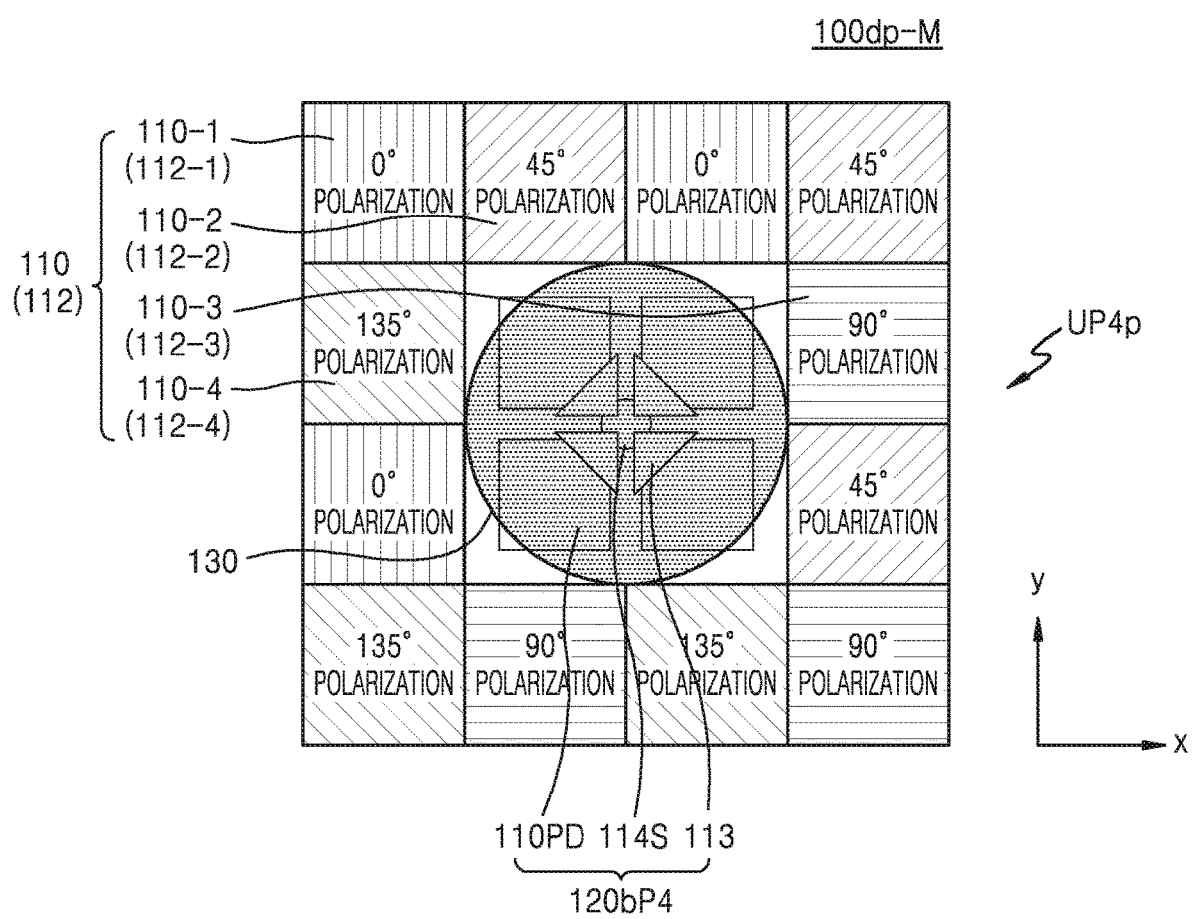

A unit pixel UP4p of the 3D image sensor 100dp-M of FIG. 7D, which illustrates a unit pixel UP4p having a pixel structure that has the fourth structure as described with reference to FIG. 2D, may have a rectangular shape in a 4×4 array structure and include the twelve polarization pixels 110 and the one multi-PD-based depth pixel 120bP4. The one depth pixel 120bP4 may have a size amounting to the four polarization pixels 110. The one microlens 130 corresponding to one depth pixel 120bP4 may be arranged on the depth pixel 120bP4. The depth pixel 120bP4 may have, but not limited to, the 4PD pixel structure. Meanwhile, the depth pixel 120bP4 may have a 4-shared structure in which the four photodiodes 110PD share one FD region 114S. However, the depth pixel 120bP4 may also have the no-shared structure, or the 2-shared structure in which the two photodiodes 110PD share the one FD region 114S.

Although not shown in detail, similarly with the 3D image sensors 100ea-M, 100de-M, and 100f-M of FIGS. 4A through 4C, 3D image sensors including multi-PD-based depth pixels according to some example embodiments may have various density relationships of 1:1, 3:1, 8:1, etc., between the polarization pixels 110 and the depth pixels, in size terms.

Figure 8:
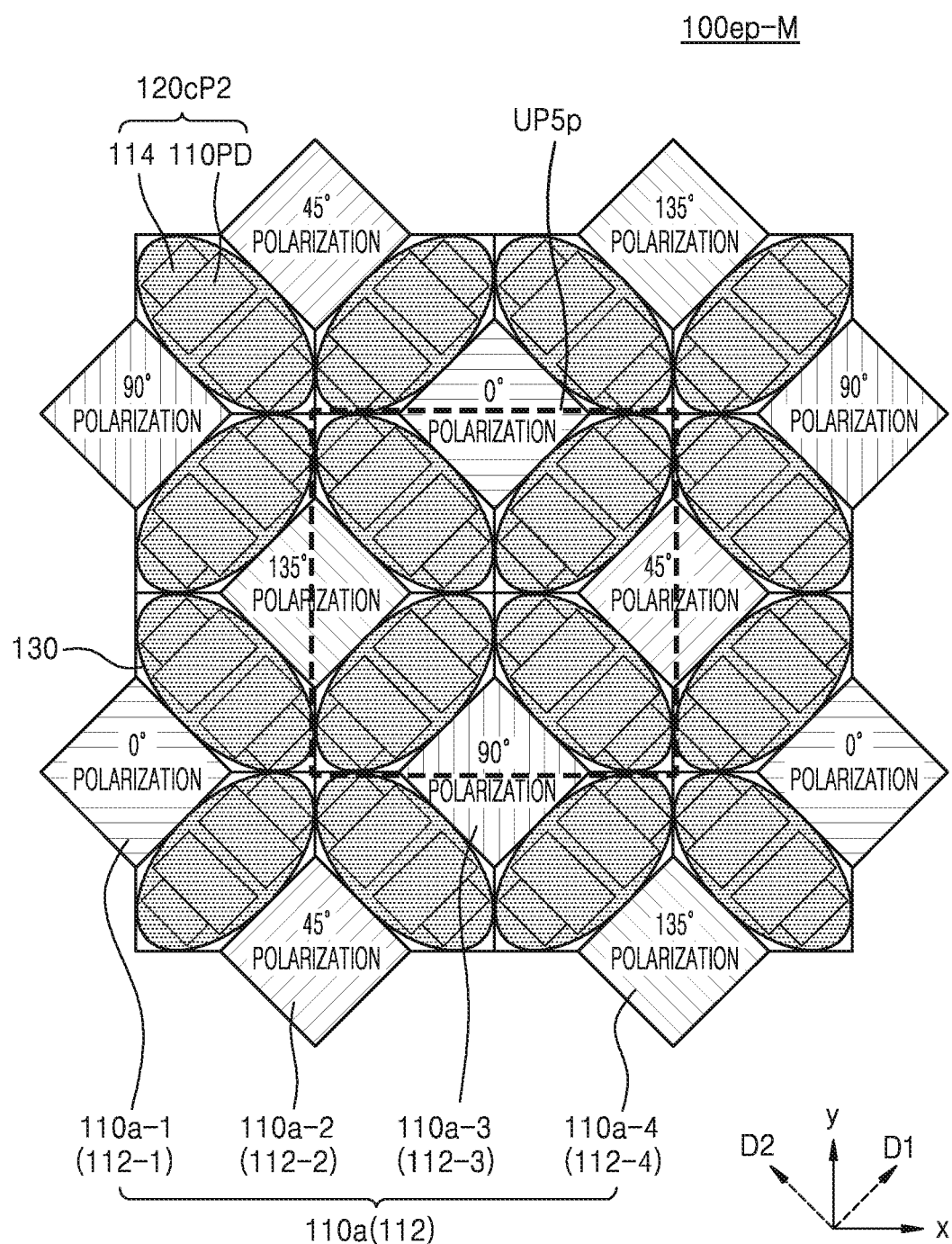
FIG. 8 is a conceptual diagram showing a structure where polarization pixels and multi-PD-based depth pixels are combined in a 3D image sensor according to some example embodiments of the inventive concepts.

FIG. 8 is a conceptual diagram showing a structure where polarization pixels and multi-PD-based depth pixels are mixed in a 3D image sensor according to some example embodiments of the inventive concepts.

Referring to FIG. 8, a 3D image sensor 100ep-M according to some example embodiments may be different from the 3D image sensor 100ga-M of FIG. 5 in a sense that a depth pixel 120cP2 is based on multi-PDs. For example, in the 3D image sensor 100ep-M of the current embodiment, the polarization pixels 110a and the depth pixels 120cP2 may be arranged alternately in the two diagonal directions D1 and D2 between the first direction (the x direction) and the second direction (the y direction). The multi-PD-based depth pixel 120cP2 may have, but not limited to, the 2PD pixel structure. Meanwhile, in FIG. 8, the depth pixel 120cP2 has a structure in which respective FD regions 114 are arranged on the two photodiodes 110PD, but similarly with the depth pixel 120P2 of the 3D image sensor 100ap-M of FIG. 7A, the depth pixel 120cP2 may also have a structure in which the two photodiodes 110PD share the one FD region 114.

A unit pixel UP5p of the 3D image sensor 100ep-M according to some example embodiments may have substantially the same structure as the unit pixel UP7a of the 3D image sensor 100ga-M of FIG. 5. Thus, the unit pixel UP5p may include the two polarization pixels 110a and the four depth pixels 120cP2 and may have the rectangular structure, such that the unit pixel UP5p has a structure in which the four depth pixels 120cP2 define separate, respective vertices of a rectangle, as shown in at least FIG. 8, and four polarization pixels 110a at least partially define separate, respective sides of four sides of the rectangle, each polarization pixel 110a of the four polarization pixels 110a shared with an adjacent unit pixel UP5p of the plurality of unit pixels UP5p, and the plurality of unit pixels UP5p define an alternative pattern of depth pixels 120cP2 and polarization pixels 110a in two diagonal directions, each diagonal direction of the two diagonal directions extending along a different diagonal of the rectangle.

Figure 9A:
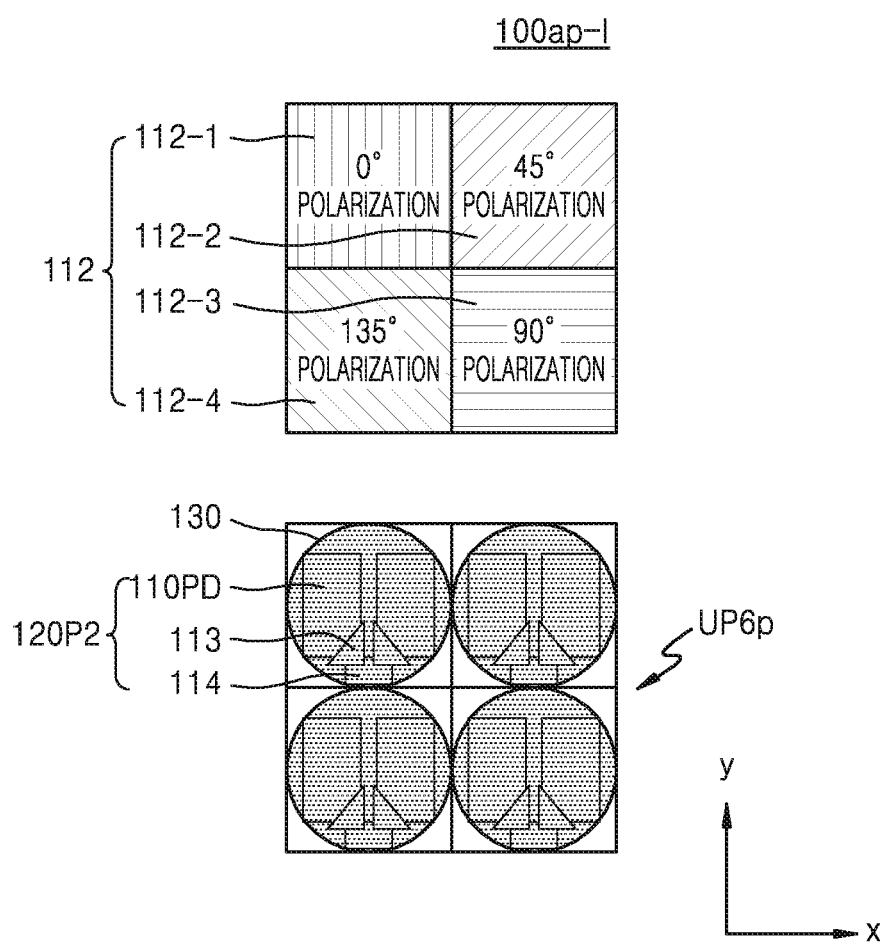
FIGS. 9A, 9B, and 9C are conceptual diagrams showing a structure where a polarizer is arranged on multi-PD-based depth pixels in 3D image sensors according to some example embodiments of the inventive concepts.
Figure 9B:
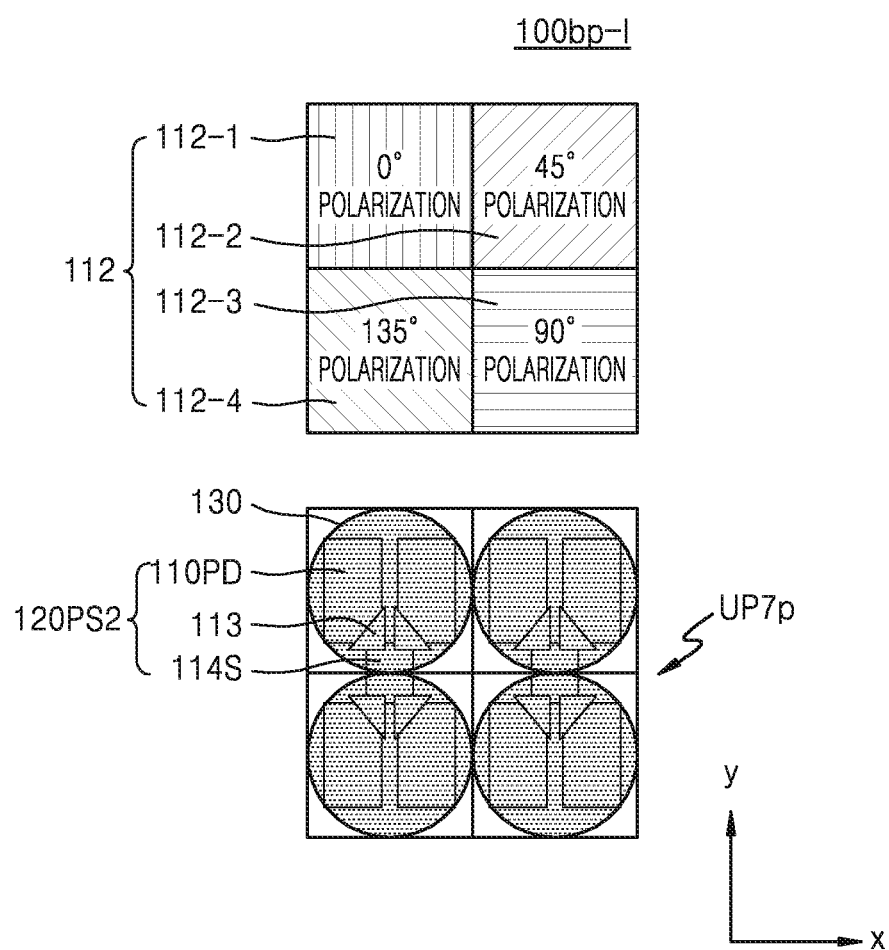
Figure 9C:
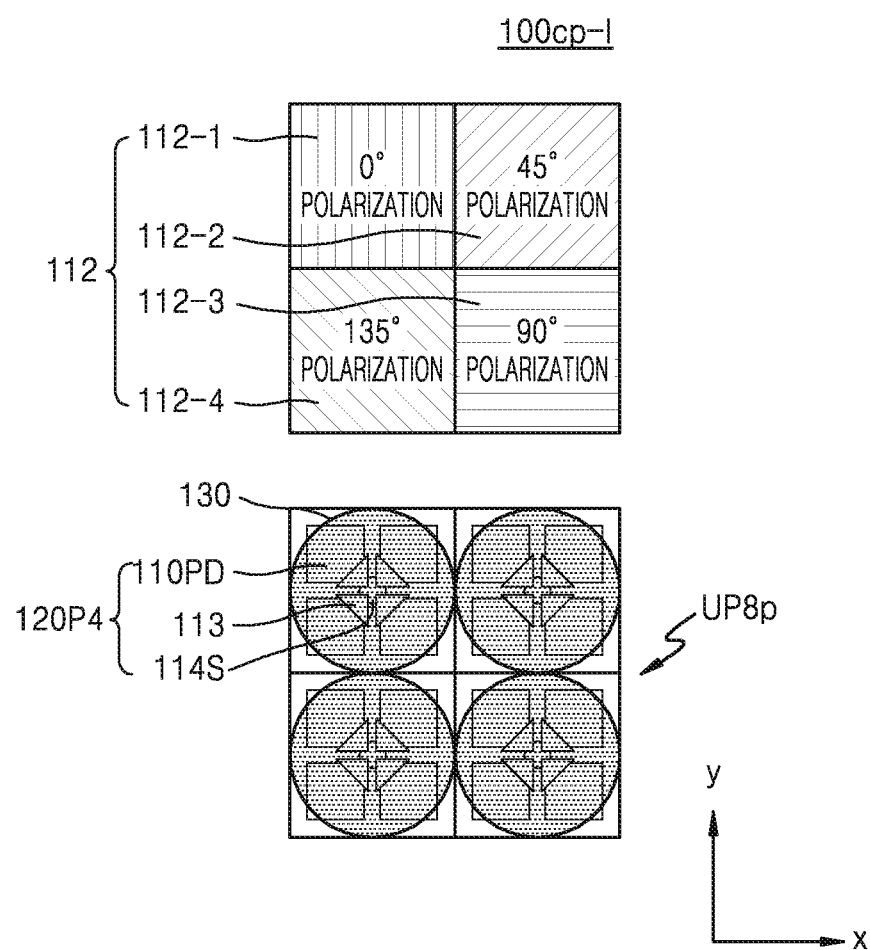

FIGS. 9A, 9B, and 9C are conceptual diagrams showing a structure where a polarizer is arranged on multi-PD-based depth pixels in 3D image sensors according to some example embodiments of the inventive concepts.

Referring to FIG. 9A, a 3D image sensor 100ap-I according to some example embodiments may have the second coupling structure where the polarizers 112 are arranged on the multi-PD-based depth pixels 120P2. The 3D image sensor 100ap-I according to some example embodiments may not include a polarization pixel. The polarizers 112 are shown separately from the depth pixels 120P2 in FIG. 9A, but in practice the four polarizers 112 may be arranged on the four depth pixels 120P2.

The depth pixel 120P2 may have, but not limited to, the 2PD pixel structure. The depth pixel 120P2 may have the 2-shared structure where two PDs share an FD region as shown in FIG. 9A. However, according to some example embodiments, the depth pixel 120P2 may have the no-shared structure.

A unit pixel UP6p of the 3D image sensor 100ap-I according to some example embodiments may include the four depth pixels 120P2 in the 2×2 array structure. The 0°, 45°, 90°, and 135° polarizers 112-1, 112-2, 112-3, and 112-4 may be arranged on the four depth pixels 120P2 of the unit pixel UP6p, such that the fourth depth pixels 120P2 include corresponding 0°, 45°, 90°, and 135° polarizers 112-1, 112-2, 112-3, and 112-4, respectively, and the pixel structure of the unit pixel UP6p is a 2-shared 2PD pixel structure.

Referring to FIG. 9B, a 3D image sensor 100bp-I according to some example embodiments may be similar with the 3D image sensor 100ap-I of FIG. 9A in a sense that the 3D image sensor 100bp-I has the second coupling structure where the polarizers 112 are arranged on multi-PD-based depth pixels 120PS2. However, the 3D image sensor 100bp-I according to some example embodiments may be different from the 3D image sensor 100ap-I of FIG. 9A in a sense that the depth pixel 120PS2 has the 4-shared structure where the two depth pixels 120PS2 share the one FD region 114S. In other words, in the structure of the depth pixel 120PS2 of the 3D image sensor 100bp-I according to some example embodiments, the four photodiodes 110PD may share the one FD region 114S.

A unit pixel UP7p of the 3D image sensor 100bp-I according to some example embodiments may include the four depth pixels 120PS2 in the 2×2 array structure, and the four polarizers 112 having different polarization directions may be arranged on the four depth pixels 120PS2 in the unit pixel UP7p, such that the four depth pixels 120PS2 include corresponding 0°, 45°, 90°, and 135° polarizers 112-1, 112-2, 112-3, and 112-4, respectively, and the pixel structure of the unit pixel UP7p is a 4-shared 2PD pixel structure.

Referring to FIG. 9C, a 3D image sensor 100cp-I according to some example embodiments may be similar with the 3D image sensor 100ap-I of FIG. 9A in a sense that the 3D image sensor 100bp-I has the second coupling structure where the polarizers 112 are arranged on multi-PD-based depth pixels 120P4. However, the 3D image sensor 100cp-I may be different from the 3D image sensor 100ap-I of FIG. 9A in a sense that the depth pixel 120P4 has the 4-PD pixel structure. In the 3D image sensor 110cp-I, the depth pixel 120P4 may have the 4-shared structure in which the four photodiodes 110PD share one FD region 114S.

A unit pixel UP8p of the 3D image sensor 100cp-I according to some example embodiments may include the four depth pixels 120P4 in the 2×2 array structure, and the four polarizers 112 having different polarization directions may be arranged on the four depth pixels 120P4 in the unit pixel UP8p, such that the four depth pixels 120P4 include corresponding 0°, 45°, 90°, and 135° polarizers 112-1, 112-2, 112-3, and 112-4, respectively, and the pixel structure of the unit pixel UP8p is a 4-shared 4-PD pixel structure.

While the 2PD pixel structure of the 2-shared structure and the 4-shared structure for the depth pixel, and the 4PD pixel structure of the 4-shared structure for the depth pixel in the 3D image sensors 100ap-I, 100ap-I, and 100cp-I in FIGS. 9A through 9C have been described, the depth pixel structure is not limited to this example. For example, the 2PD pixel structure may also have the no-shared structure or the 8-shared structure. In addition, the 4PD pixel structure may also have the no-shared structure, the 2-shared structure, or the 8-shared structure.

FIGS. 10A, 10B, 10C, 10D, and 10E are conceptual diagrams showing a structure where a polarizer is arranged on ToF-based depth pixels in 3D image sensors according to some example embodiments of the inventive concepts.

Figure 10A:
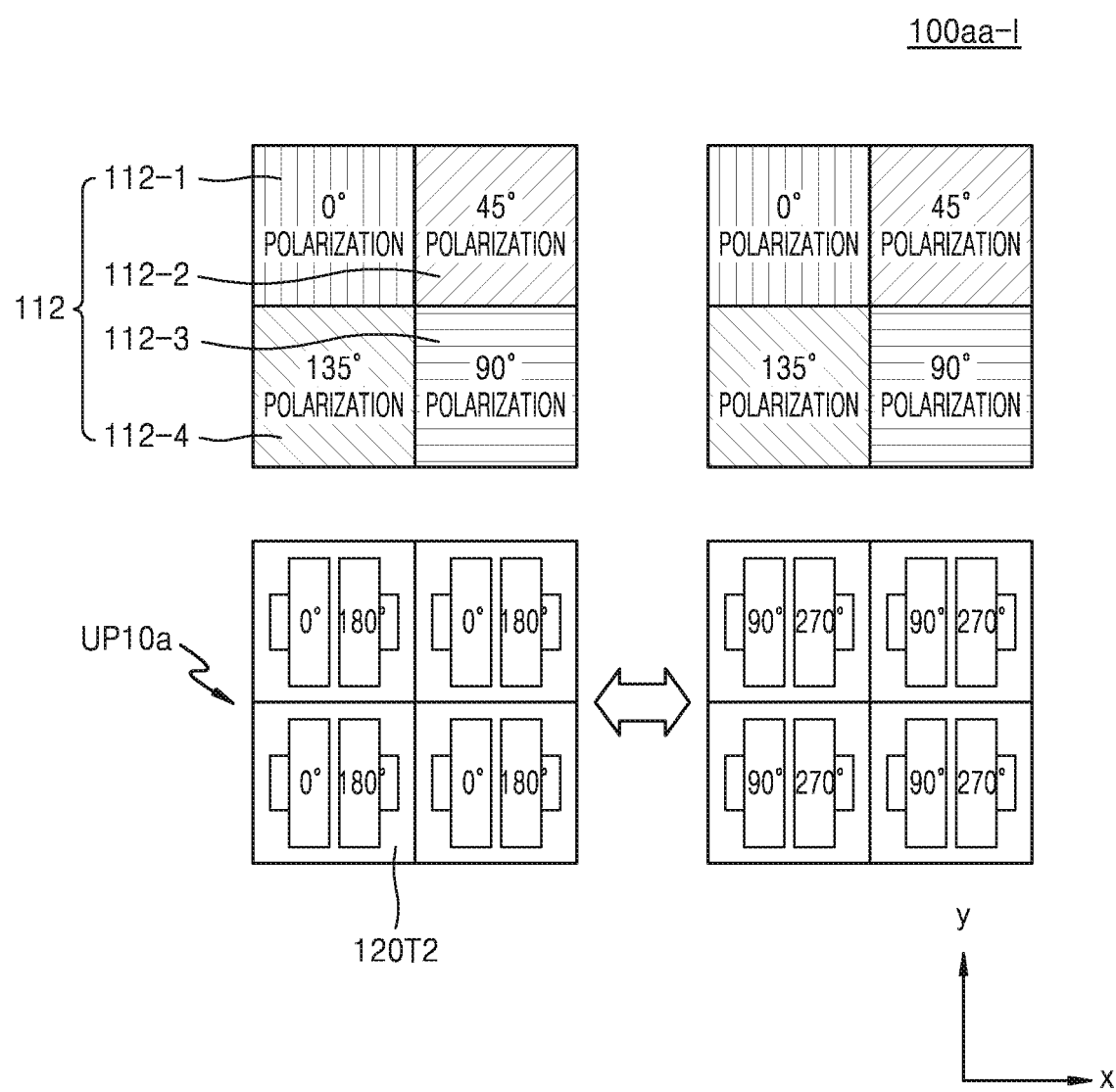
FIGS. 10A, 10B, 10C, 10D, and 10E are conceptual diagrams showing a structure where a polarizer is arranged on ToF-based depth pixels in 3D image sensors according to some example embodiments of the inventive concepts.

Referring to FIG. 10A, a 3D image sensor 100aa-I according to some example embodiments may differ from the 3D image sensor 100ap-I of FIG. 9A in a sense that the 3D image sensor 100aa-I has the second coupling structure where the polarizers 112 are arranged on the ToF-based depth pixels 120T2. The 3D image sensor 100aa-I according to some example embodiments may not include a separate polarization pixel, and the depth pixel 120T2 may have the 2-tap pixel structure. Thus, in the 3D image sensor 100aa-I according to some example embodiments, the depth pixels 120T2 may operate by performing sampling twice alternately for the 0° and 180° phases and for the 90° and 270° phases. Accordingly, as shown in FIG. 10A, the unit pixel UP10a may have a first structure including four pixels 120T2 in a 2×2 array structure in which each pixel 120T2 of the four pixels 120T2 has a 2-tap pixel structure and the four pixels 120T2 include corresponding 0°, 45°, 90°, and 135° polarizers 112, respectively.

A unit pixel UP10a of the 3D image sensor 100aa-I according to some example embodiments may include the four depth pixels 120T2 in the 2×2 array structure, and the four polarizers 112 having different polarization directions may be arranged on the four depth pixels 120T2 in the unit pixel UP10a.

Figure 10B:
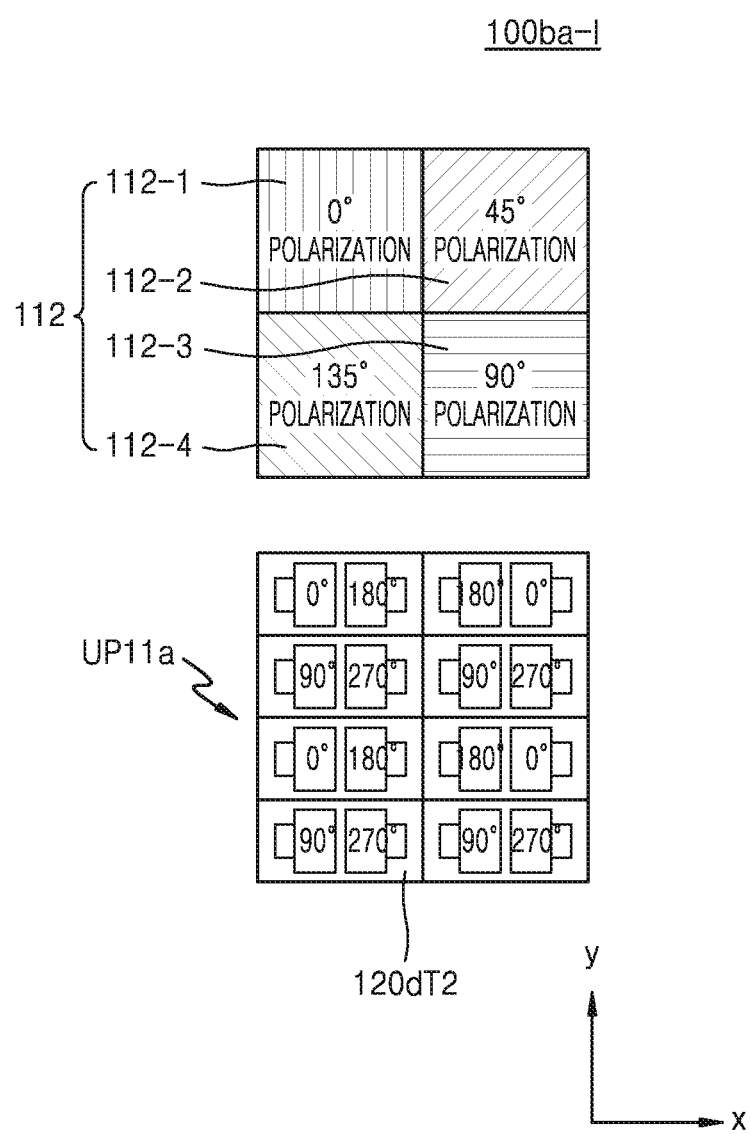

Referring to FIG. 10B, a 3D image sensor 100ba-I according to some example embodiments may be similar with the 3D image sensor 100aa-I of FIG. 10A in a sense that the 3D image sensor 100ba-I has the second coupling structure where the polarizers 112 are arranged on the ToF-based depth pixels 120dT2 and that the depth pixel 120dT2 has the 2-tap pixel structure. However, the 3D image sensor 100ba-I according to some example embodiments may differ from the 3D image sensor 100aa-I of FIG. 10A in a sense that although the depth pixel 120dT2 has the 2-tap pixel structure, the two depth pixels 120dT2 perform a 4-tap pixel function through coupling therebetween. Thus, in the 3D image sensor 100ba-I according to some example embodiments, the two depth pixels 120dT2 may perform sampling once for four phases.

In the 3D image sensor 100ba-I according to some example embodiments, the depth pixel 120dT2 has a half size of the polarizer 112, and the two depth pixels 120dT2 performing the 4-tap pixel function may have a size amounting to one polarizer 112. Thus, one polarizer 112 having the same polarization direction may be arranged on the two depth pixels 120dT2 performing the 4-tap pixel function.

A unit pixel UP11a of the 3D image sensor 100ba-I according to some example embodiments may include the eight depth pixels 120dT2 in the 4×2 array structure. In addition, the four polarizers 112 having different polarization directions may be arranged on the eight depth pixels 120dT2 in the unit pixel UP11a. As stated above, one polarizer 112 having the same polarization direction may be arranged on the two depth pixels 120dT2 performing the 4-tap pixel function. Accordingly, as shown in FIG. 10B, the unit pixel UP11a may have a second structure including eight pixels in a 2×4 array structure in which each pixel 120dT2 of the eight pixels 120dT2 has the 2-tap pixel structure, and each two of the eight pixels form 4 taps and include 0°, 45°, 90°, and 135° polarizers 112 corresponding to the four taps, respectively.

Figure 10C:
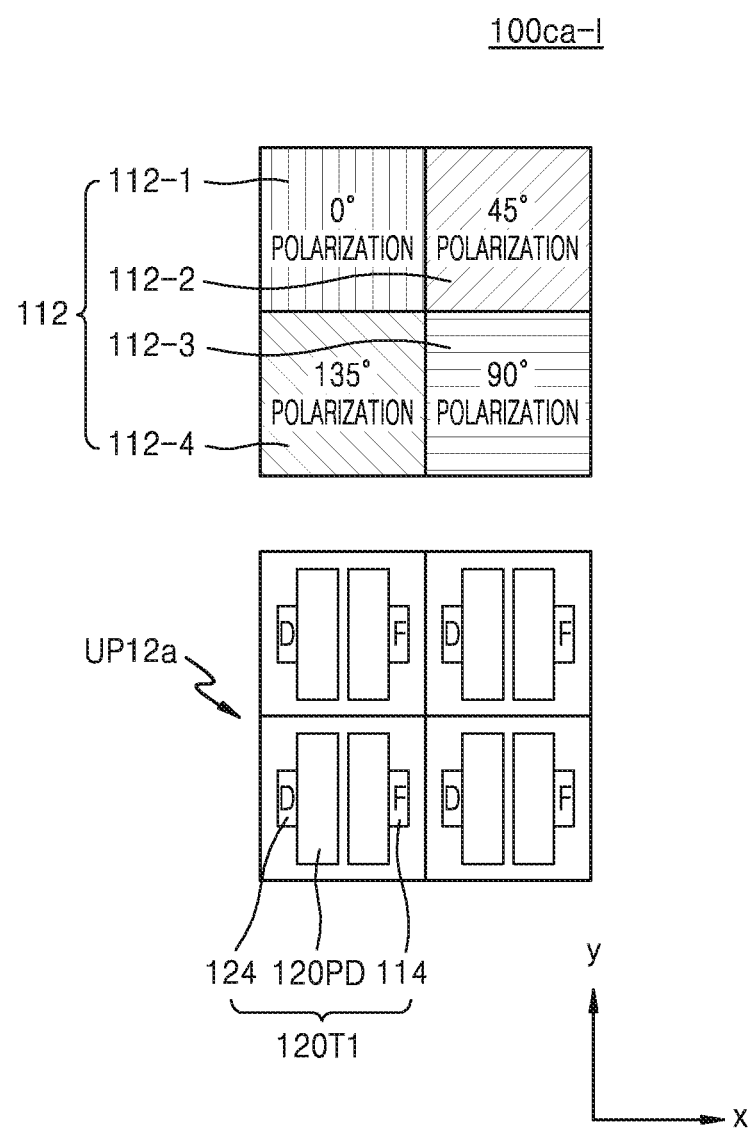

Referring to FIG. 10C, a 3D image sensor 100ca-I according to some example embodiments may be similar with the 3D image sensor 100aa-I of FIG. 10A in a sense that the 3D image sensor 100ca-I has the second coupling structure where the polarizers 112 are arranged on ToF-based depth pixels 120T1. However, the 3D image sensor 100ca-I according to some example embodiments may be different from the 3D image sensor 100aa-I of FIG. 10A in a sense that the depth pixel 120T1 has the 1-tap pixel structure. Thus, in the 3D image sensor 100ca-I according to some example embodiments, the depth pixels 120T2 may operate by performing sampling four times for the four phases. In FIG. 10C, a part indicated by F may mean the FD region 114, and a part indicated by D may mean a drain region 124. For the 1-tap pixel structure, electric charges generated in one of the charge generation regions 120PD are not used and thus are discharged through the drain region 124.

A unit pixel UP12a of the 3D image sensor 100Ca-I according to some example embodiments may include the four depth pixels 120T1 in the 2×2 array structure, and the four polarizers 112 having different polarization directions may be arranged on the four depth pixels 120T1 in the unit pixel UP12a. Accordingly, as shown in FIG. 10C, the unit pixel UP12a may have a third structure including four pixels 120T1 in the 2×2 array structure in which each pixel 120T1 of the four pixels 120T1 has the 1-tap pixel structure and the four pixels 120T1 include corresponding 0°, 45°, 90°, and 135° polarizers 112, respectively.

Figure 10D:
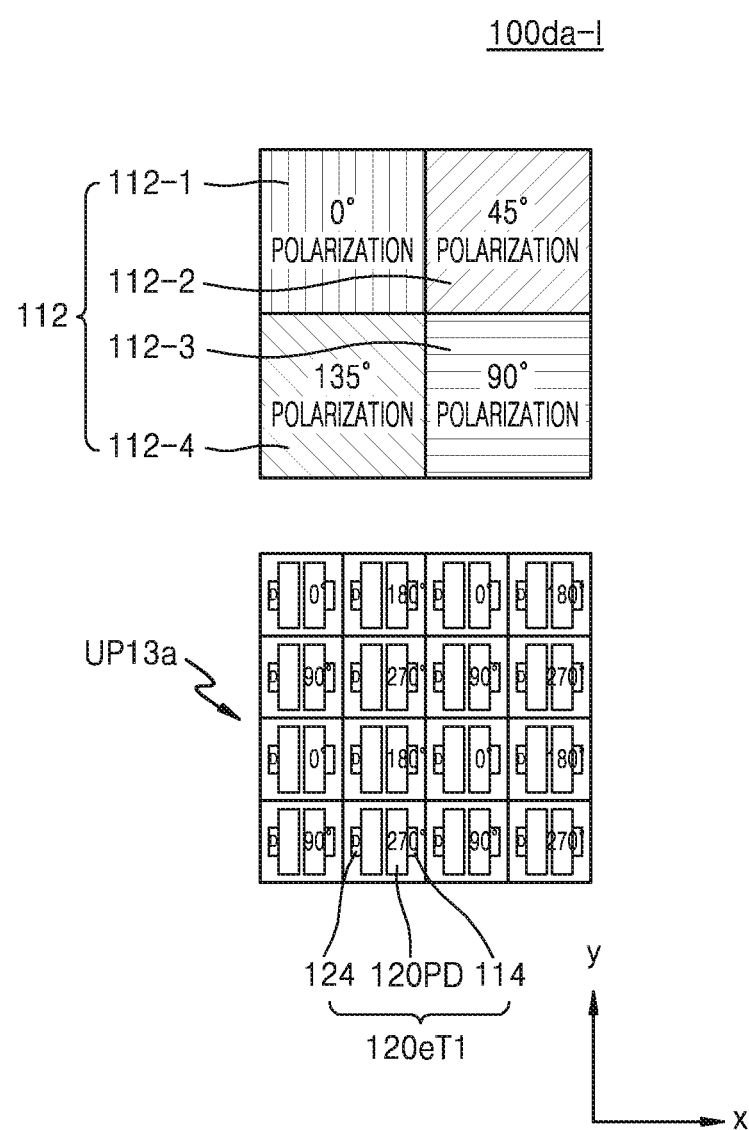

Referring to FIG. 10D, a 3D image sensor 100da-I according to some example embodiments may be similar with the 3D image sensor 100ca-I of FIG. 10C in a sense that the 3D image sensor 100da-I has the second coupling structure where the polarizers 112 are arranged on the ToF-based depth pixels 120eT1 and that the depth pixel 120eT1 has the 1-tab pixel structure. However, the 3D image sensor 100da-I according to some example embodiments may differ from the 3D image sensor 100ca-I of FIG. 10C in a sense that although the depth pixel 120eT1 has the 1-tap pixel structure, the four depth pixels 120eT1 perform a 4-tap pixel function through coupling thereamong. Thus, in the 3D image sensor 100da-I according to some example embodiments, the four depth pixels 120eT1 may perform sampling once for four phases.

Also, in the 3D image sensor 100da-I according to some example embodiments, the depth pixel 120eT1 may have a ¼ size of the polarizer 112. Thus, the four depth pixels 120eT1 performing the 4-tap pixel function may have a size amounting to one polarizer 112. Thus, one polarizer 112 having the same polarization direction may be arranged on the four depth pixels 120eT1 performing the 4-tap pixel function.

A unit pixel UP13a of the 3D image sensor 100da-I according to some example embodiments may include the sixteen depth pixels 120eT1 in the 4×4 array structure. In addition, the four polarizers 112 having different polarization directions may be arranged on the sixteen depth pixels 120eT1 in the unit pixel UP13a. As stated above, one polarizer 112 having the same polarization direction may be arranged on the four depth pixels 120eT1 performing the 4-tap pixel function. Accordingly, as shown in FIG. 10D, the unit pixel UP13a may have a fourth structure including sixteen pixels 120eT1 in a 4×4 array structure in which each pixel 120eT1 of the sixteen pixels has the 1-tap pixel structure, and each four pixels 120eT1 of the sixteen pixels 120eT1 form 4 taps and include 0°, 45°, 90°, and 135° polarizers 112 corresponding to the four taps, respectively.

Figure 10E:
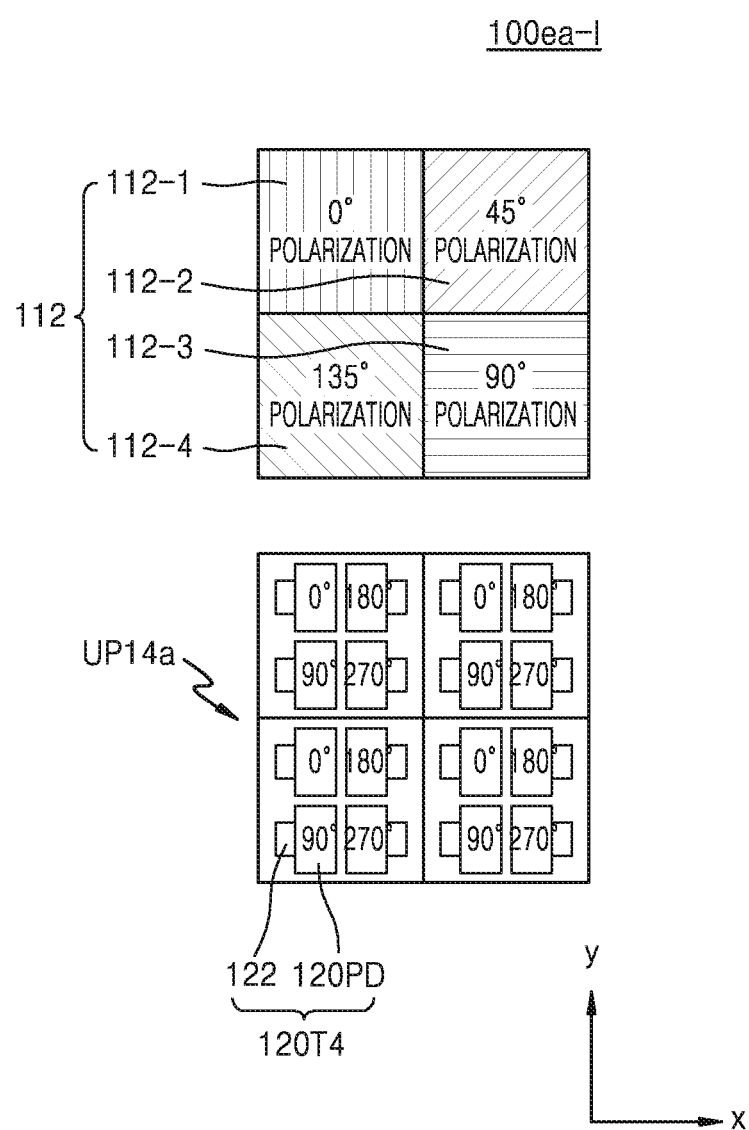

Referring to FIG. 10E, a 3D image sensor 100ea-I according to some example embodiments may be similar with the 3D image sensor 100aa-I of FIG. 10A in a sense that the 3D image sensor 100ea-I has the second coupling structure where the polarizers 112 are arranged on ToF-based depth pixels 120T4. However, the 3D image sensor 100ea-I according to some example embodiments may be different from the 3D image sensor 100aa-I of FIG. 10A in a sense that the depth pixel 120T4 has the 4-tap pixel structure. Thus, in the 3D image sensor 100ea-I according to some example embodiments, the depth pixels 120T4 may operate by performing sampling once for the four phases.

In the 3D image sensor 100ea-I according to some example embodiments, the depth pixel 120T4 may have substantially the same size as that of the polarizer 112. Thus, one polarizer 112 may be arranged on one depth pixel 120T4. A unit pixel UP14a of the 3D image sensor 100ea-I according to some example embodiments may include the four depth pixels 120T4 in the 2×2 array structure, and the four polarizers 112 having different polarization directions may be arranged on the four depth pixels 120T4 in the unit pixel UP14a. Accordingly, as shown in FIG. 10E, the unit pixel UP14a may have a fifth structure including four pixels 120T4 in the 2×2 array structure in which each pixel 120T4 of the four pixels 120T4 has the 4-tap pixel structure and the four pixels 120T4 include corresponding 0°, 45°, 90°, and 135° polarizers 112, respectively.

Figure 11:
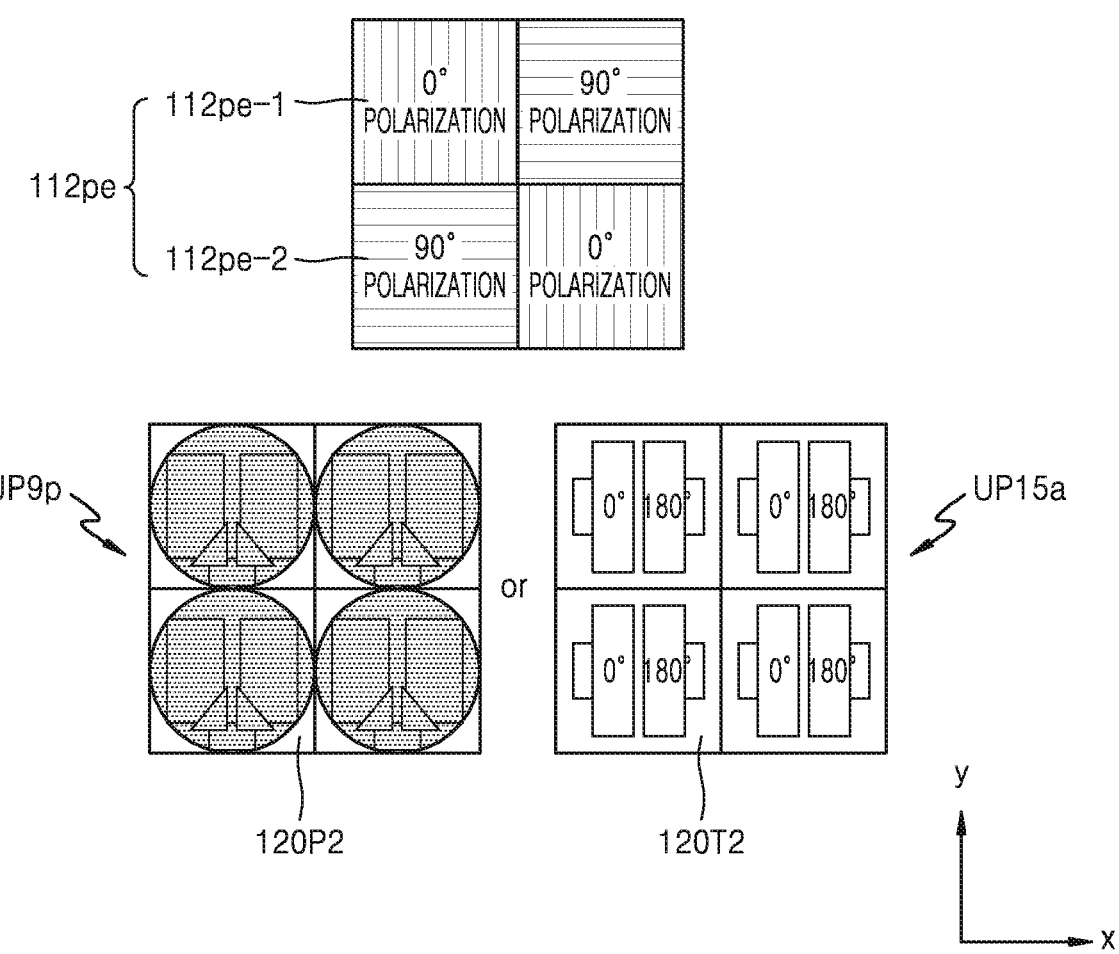
FIG. 11 is a conceptual diagram showing a structure where a polarizer is arranged on multi-PD-based depth pixels or ToF-based depth pixels in 3D image sensors according to some example embodiments of the inventive concepts.

FIG. 11 is a conceptual diagram showing a structure where a polarizer is arranged on multi-PD-based depth pixels or ToF-based depth pixels in 3D image sensors according to some example embodiments of the inventive concepts.

Referring to FIG. 11, a 3D image sensor 100dp-I or 100fa-I according to some example embodiments may be similar with the 3D image sensor 100ap-I of FIG. 9A or the 3D image sensor 100aa-I of FIG. 10A in a sense that the 3D image sensor 100dp-I or 100fa-I has the second coupling structure where polarizers 112pe are arranged on multi-PD-based depth pixels 120P2 or ToF-based depth pixels 120T2. However, the 3D image sensor 100dp-I or 100fa-I according to some example embodiments may be different from the 3D image sensor 100ap-I of FIG. 9A and the 3D image sensor 100aa-I of FIG. 10A in a sense that polarization directions of the adjacent polarizers 112pe are perpendicular to each other. For example, as shown in FIG. 11, a pair of two 0° and 90° polarizers 112pe-1 and 112pe-2 of the four polarizers 112pe and a pair of other two 0° and 90° polarizers 112pe-1 and 112pe-2 of the four polarizers may be arranged adjacent to each other in the first direction (the x direction) and in the second direction (the y direction). Accordingly, as shown in FIG. 11, a unit pixel UP9p or UP15a may include four polarizers 112pe in a 2×2 array structure in which the polarizers 112 associated with two polarization directions that are perpendicular to each other (e.g., 0° and 90°) at least partially define a checkerboard pattern. A checkerboard pattern may include a check pattern, also referred to as a checker pattern and/or chequered pattern.

In the 3D image sensors 100dp-I or 100fa-I according to some example embodiments, the depth pixels 120PS2 and 120P4 of the 3D image sensors 100bp-I and 100cp-I of FIGS. 9B and 9C may be arranged in place of the multi-PD-based depth pixels 120P2. Instead of the ToF-based depth pixels 120T2, the depth pixels 120dT2, 120T1, 120eT1, and 120T4 of the 3D image sensors 100ba-I, 100ca-I, 100da-I, and 100ea-I of FIGS. 10B through 10E may be arranged.

Figure 12A:
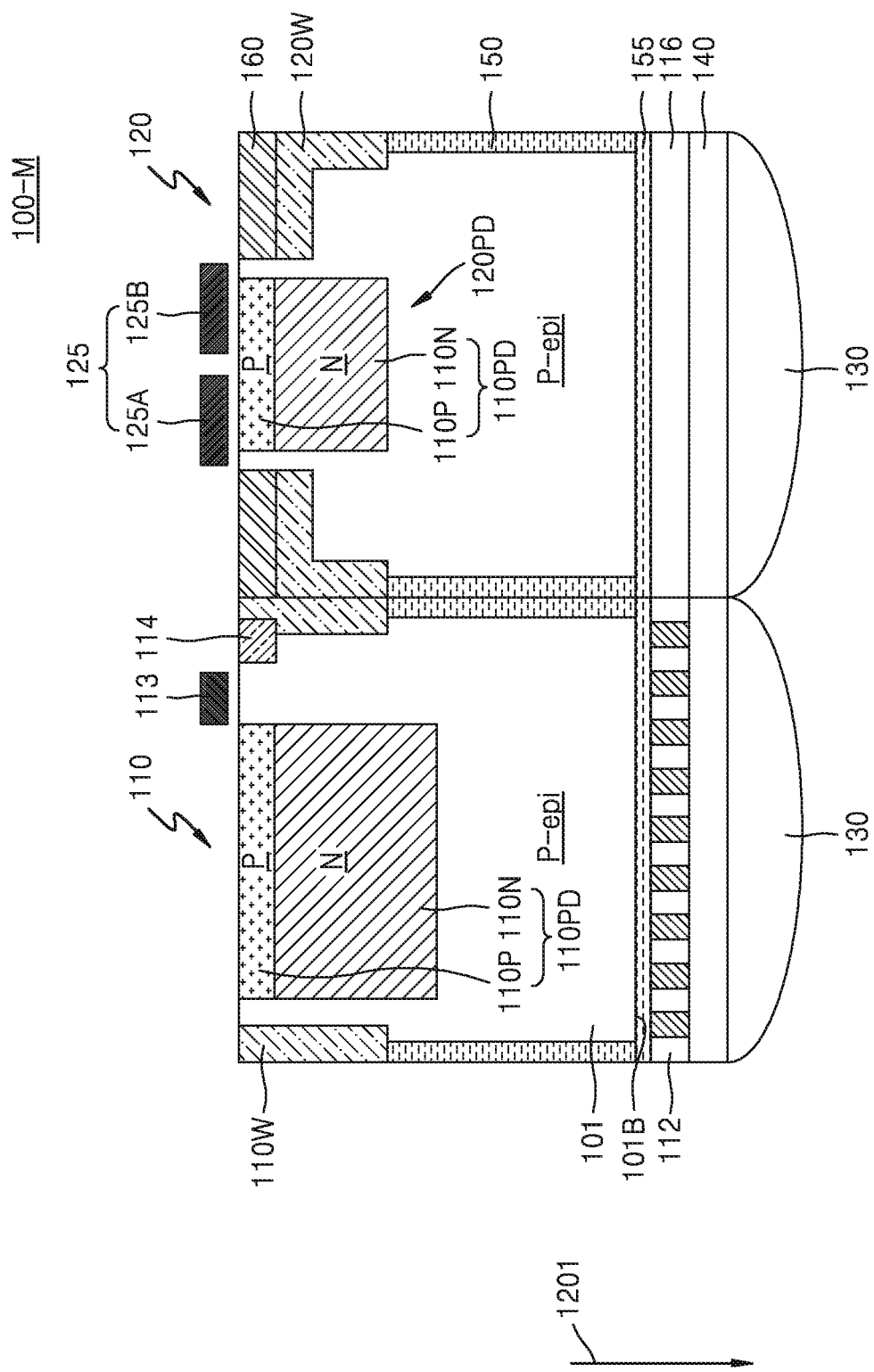
FIGS. 12A and 12B are cross-sectional views showing a cross-section of a 3D image sensor having a first coupling structure and a cross-section of a 3D image sensor having a second coupling structure in 3D image sensors according to some example embodiments of the inventive concepts.
Figure 12B:
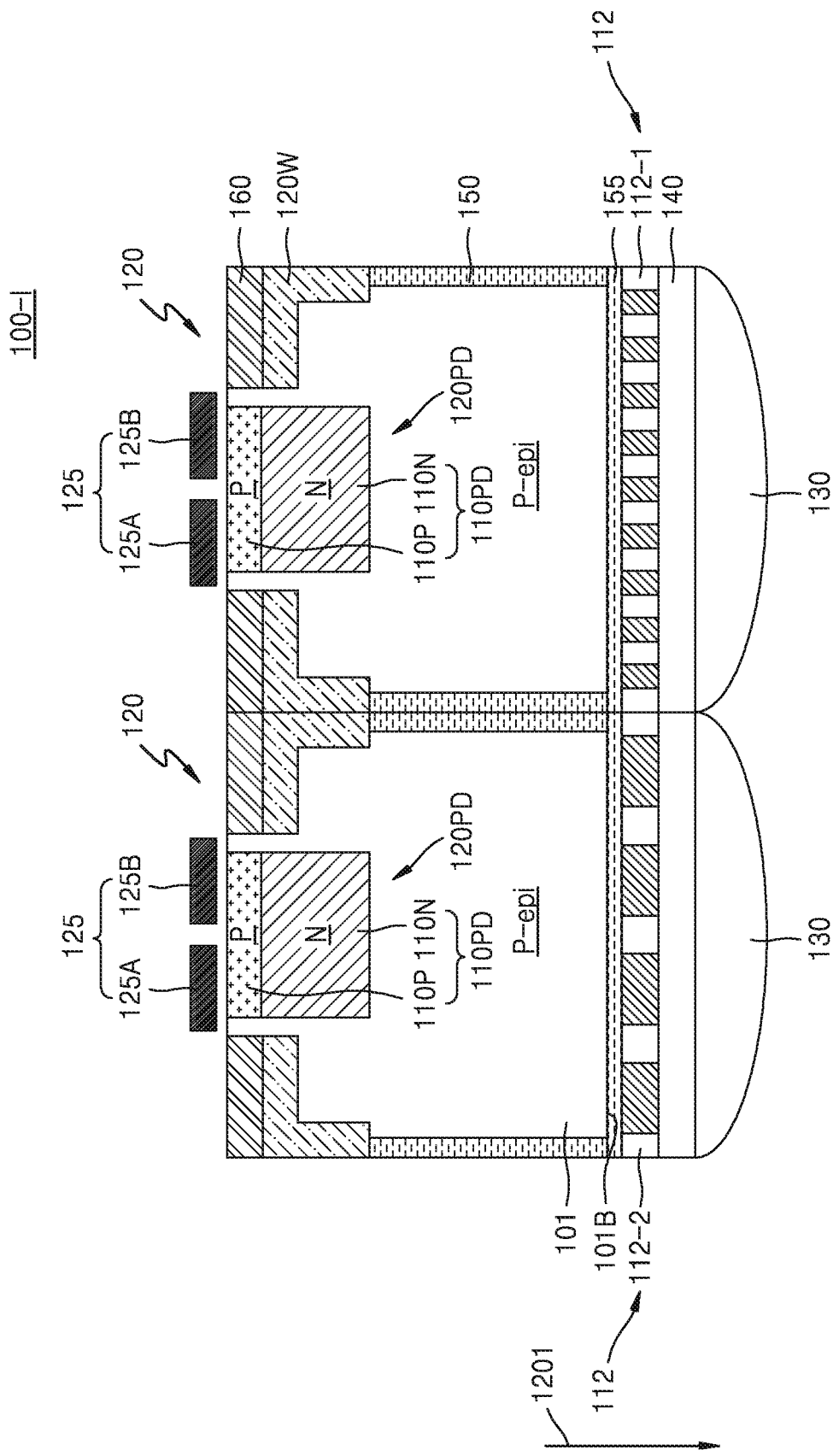

FIGS. 12A and 12B are cross-sectional views showing a cross-section of a 3D image sensor having a first coupling structure and a cross-section of a 3D image sensor having a second coupling structure in 3D image sensors according to some example embodiments of the inventive concepts.

Referring to FIG. 12A, a 3D image sensor 100-M according to some example embodiments may have the first coupling structure where the polarization pixel 110 and the depth pixel 120 are mixed. The depth pixel 120 shown in FIG. 12A may be any of the depth pixels 120 included in any of the example embodiments described herein with reference to any of the Figures. The polarization pixel 110 shown in FIG. 12A may be any of the polarization pixels 110 included in any of the example embodiments described herein with reference to any of the Figures.

The polarization pixel 110 may include a substrate 101, the photodiode 110PD, the polarizer 112, and the microlens 130. The polarization pixel 110 may be configured to generate shape information associated with a shape of a surface of an object in a 3D scene based on detecting light reflected from the object (e.g., light received at the polarization pixel 110 via the light-incident direction 1201). The substrate 101 may include a P-type epitaxial (P-epi) substrate. As shown in FIG. 12A, the photodiode 110PD may be in the substrate 101, such that the photodiode 110PD is at least partially enclosed within a volume defined by the outer surfaces of the substrate 101. The photodiode 110PD may include an N-type doped region 110N and a P-type doped region 110P that are formed in the substrate 101. The microlens 130 may be arranged on the substrate 101 in a light-incident direction 1201. For example, as shown in FIG. 12A, the microlens 130 may be arranged on a back surface 101B of the substrate 101.

As shown in FIG. 12A, the polarizer 112 may be on the substrate 101 (e.g., on the back surface 101B of the substrate 101) in the light-incident direction 1201. The polarizer 112 may be arranged between the substrate 101 and the microlens 130. The polarizer 112 may have a structure where a grating is formed with metal (e.g., the polarizer 112 may include a metal grating on the substrate 101) or a high-dielectric material (e.g., the polarizer 112 may include a high-dielectric material grating on the substrate 101) in an insulating layer. Meanwhile, a planarizing insulation layer 140 may be between the polarizer 112 and the microlens 130. A rear insulation layer 155 may be arranged on a bottom surface of the substrate 101.

It will be understood that an element that is "on" another element may be above or beneath the other element. In addition, an element that is "on" another element may be directly on the other element, such that the element is in direct contact with the other element, or the element may be indirectly on the other element, such that the element is isolated from direct contact with the other element by one or more interposing spaces and/or structures.

The FD region 114 may be formed apart from (isolated from direct contact with) the photodiode 110PD on an upper region of the substrate 101, and a transfer gate 113 may be arranged above the substrate 101 between the photodiode 110PD and the FD region 114. A reset gate, a source follower gate, a select gate, etc., may be arranged on the substrate 101, but are not shown because the cross-sectional views are shown.

The depth pixel 120 may be arranged adjacent to the polarization pixel 110 and may include the substrate 101, a charge generation region 120PD, and the microlens 130. The substrate 101 of the depth pixel 120 may be continuous with the substrate 101 of the polarization pixel 110 such that a single, continuous substrate 101 defines the substrate 101 of the polarization pixel 110 and the substrate 101 of the depth pixel 120. The depth pixel 120 may be configured to generate depth information associated with a depth of an object from the 3D image sensor 100-M in a 3D scene based on detecting light reflected from the object (e.g., light received at the depth pixel 120 via the light-incident direction 1201). The depth pixel 120 may include, for example, a ToF-based depth pixel. The polarization pixel 110 and the depth pixel 120 may have a structure where they are electrically separated from each other by a DTI structure 150, a shallow trench isolation (STI) structure 160, P-type wells 110W and 120W, and so forth.

The substrate 101 may be substantially the same as the substrate 101 of the polarization pixel 110. As shown in FIG. 12A, the charge generation region 120PD may be in the substrate 101, such that the charge generation region 120PD is at least partially enclosed within a volume defined by the outer surfaces of the substrate 101. The charge generation region 120PD may be implemented with, for example, a photogate 125 and/or a photodiode. More specifically, as shown in FIG. 12A, the charge generation region 120PD may be implemented with the photodiode 110PD and the photogate 125 on an upper portion thereof. The photogate 125 may include elements 125A and 125B. In some example embodiments, the charge generation region 120PD may be implemented with the photogate 125 alone without a separate photodiode.

The microlens 130 may be arranged on a bottom surface of the substrate 101, and an insulation layer 116 corresponding to the polarizer and the planarizing insulation layer 140 may be arranged between the microlens 130 and the substrate 101. Meanwhile, a storage gate, an FD region, a reset gate, a source follower gate, a select gate, etc., may be arranged on the substrate 101, but are not shown because the cross-sectional views are shown.

Referring to FIG. 12B, a 3D image sensor 100-I according to some example embodiments may have the second coupling structure where the polarizer 112 is arranged on the depth pixel 120. The depth pixel 120 shown in FIG. 12B may be any of the depth pixels 120 included in any of the example embodiments described herein with reference to any of the Figures. The polarization pixel 110 shown in FIG. 12B may be any of the polarization pixels 110 included in any of the example embodiments described herein with reference to any of the Figures.

The structure of the depth pixel 120, which is, for example, a ToF-based depth pixel, has been described when the depth pixel 120 is described in the 3D image sensor 100-M of FIG. 12A. The polarizer 112 may be arranged between the substrate 101 and every microlens 130 of every depth pixel 120. In FIG. 12B, a difference in grating width between a polarizer 112-2 of the left depth pixel 120 and a polarizer 112-1 of the right depth pixel 120 may originate from a cross-sectional structure. For example, in the 3D image sensor 100ap-I of FIG. 9A, when the 0° and 45° polarizers 112-1 and 112-2 are cut in the first direction (the x direction), the 0° polarizer 112-1 may correspond to the polarizer 112-1 of the right depth pixel 120 and the 45° polarizer 112-2 may correspond to the polarizer 112-2 of the left depth pixel 120.

Figure 13A:
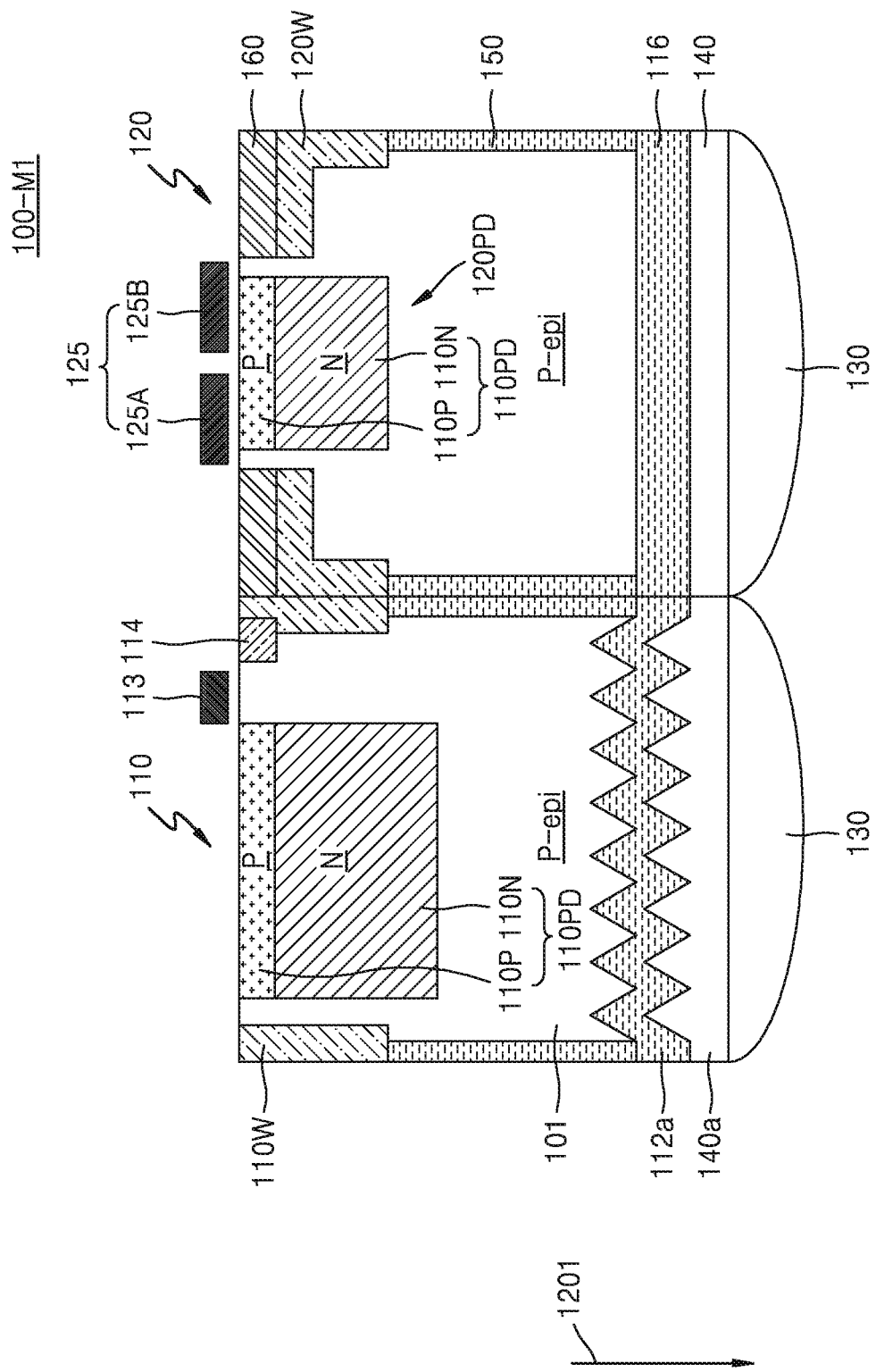
FIGS. 13A and 13B are cross-sectional views showing a cross-section of a 3D image sensor having a first coupling structure and a cross-section of a 3D image sensor having a second coupling structure in 3D image sensors according to some example embodiments of the inventive concepts.
Figure 13B:
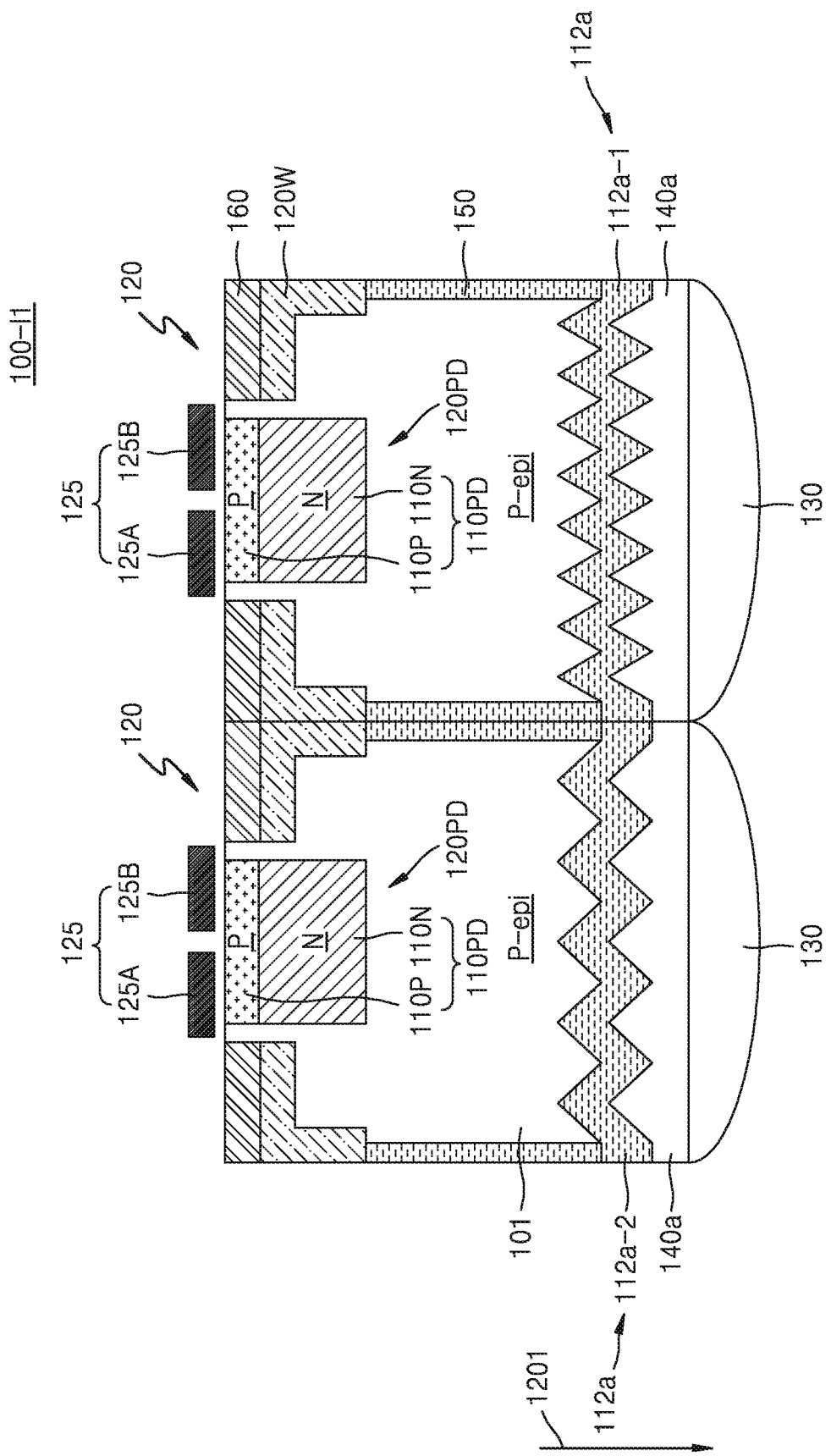

FIGS. 13A and 13B are cross-sectional views showing a cross-section of a 3D image sensor having a first coupling structure and a cross-section of a 3D image sensor having a second coupling structure in 3D image sensors according to some example embodiments of the inventive concepts. The depth pixels 120 shown in FIG. 13A-13B may be any of the depth pixels 120 included in any of the example embodiments described herein with reference to any of the Figures. The polarization pixels 110 shown in FIG. 13A-13B may be any of the polarization pixels 110 included in any of the example embodiments described herein with reference to any of the Figures.

Referring to FIG. 13A, a 3D image sensor 100-M1 according to some example embodiments may be similar with the 3D image sensor 100-M of FIG. 12A in a sense that the 3D image sensor 100-M1 has the first coupling structure where the polarization pixel 110 and the depth pixel 120 are mixed. However, in the 3D image sensor 100-M1 according to some example embodiments, a structure of a polarizer 112a may be different from the polarizer 112 of the 3D image sensor 100-M of FIG. 12A. For example, in the 3D image sensor 100-M1 according to some example embodiments, the polarizer 112a may be implemented with a structure in which a concave-convex portion is formed in the substrate 101, as shown in FIG. 13A, and is filled with a gap-fill insulation layer having a uniform thickness. As such, since the polarizer 112a is formed with the concave-convex portion of the substrate 101 and the gap-fill insulation layer, a concave-convex structure may be formed on a top surface of a planarizing insulation layer 140a that contacts the gap-fill insulation layer.

Referring to FIG. 13B, a 3D image sensor 10041 according to some example embodiments may be similar with the 3D image sensor 100-I of FIG. 12B in a sense that the 3D image sensor 10041 has the second coupling structure where the polarizer 112a is arranged on the depth pixel 120. However, in the 3D image sensor 10041 according to some example embodiments, a structure of a polarizer 112a may be different from the polarizer 112 of the 3D image sensor 100-I of FIG. 12B. For example, in the 3D image sensor 10041 according to some example embodiments, the polarizer 112a may be implemented with a structure in which a concave-convex portion is formed in the substrate 101 and is filled with a gap-fill insulation layer having a uniform thickness, as shown in FIG. 13B.

Figure 14A:
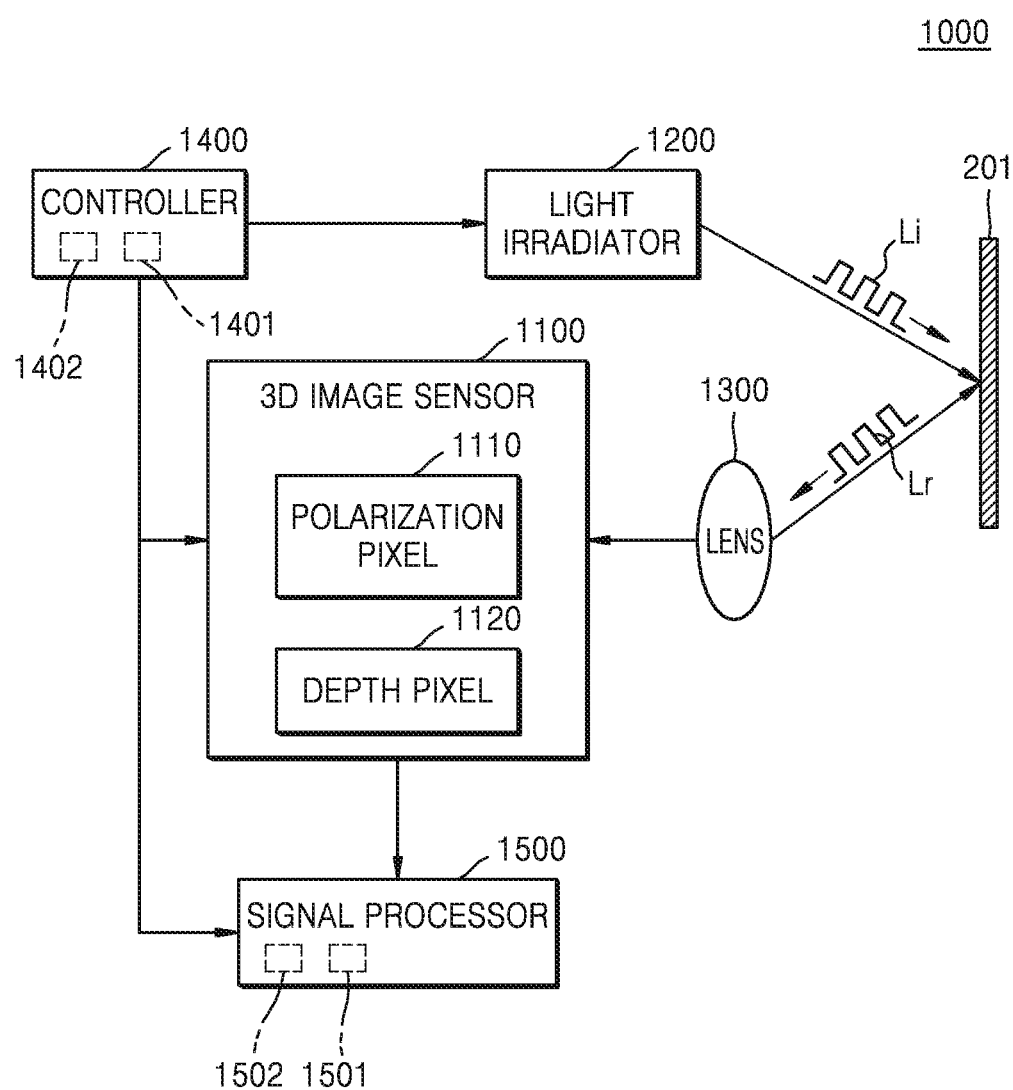
FIGS. 14A and 14B are schematic diagrams of an electronic device including a 3D image sensor of an active type according to some example embodiments of the inventive concepts.
Figure 14B:
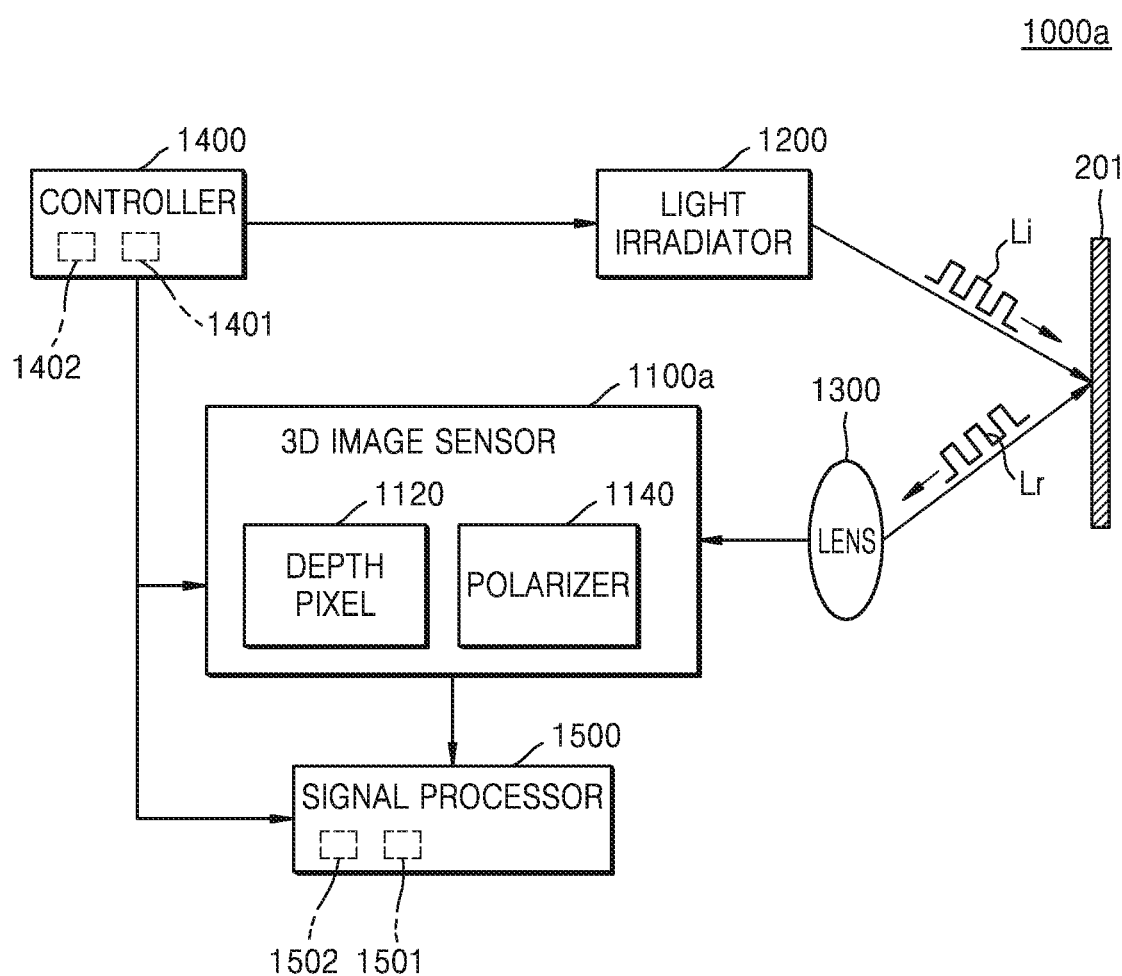

FIGS. 14A and 14B are schematic diagrams of an electronic device including a 3D image sensor of an active type according to some example embodiments of the inventive concepts.

Referring to FIG. 14A, an electronic device 1000 according to some example embodiments may include a 3D image sensor 1100, a light irradiator 1200, a lens 1300, a controller 1400, and a signal processor 1500. The 3D image sensor 1100 may have the first coupling structure where a polarization pixel 1110 and a depth pixel 1120 are mixed. The depth pixel 1120 may be an active-type depth pixel, for example, a ToF-based depth pixel. However, the depth pixel 1120 is not limited to the ToF-based depth pixel. The 3D image sensor 1100 may be, for example, the 3D image sensor 100aa-M through 100ia-M of FIGS. 3A through 6B. However, the 3D image sensor 1100 is not limited thereto.

The light irradiator 1200 may generate light and irradiate the light to an object 201. The light irradiator 1200 may generate, for example, infrared (IR) light, near infrared (NIR) light, ultraviolet (UV) light, visible light, etc., and irradiate the light to the object 201. The light irradiator 1200 may be implemented with a light-emitting diode (LED) array, a laser device, etc. The light irradiator 1200 may irradiate light Li modulated using a gate modulation method to the object 201.

The lens 1300 may collect light Lr reflected from the object 201 and deliver the collected light to the 3D image sensor 1100. The controller 1400 may control the 3D image sensor 1100, the light irradiator 1200, and the signal processor 1500 as a whole. The signal processor 1500 may generate a depth image, i.e., a 3D image, for the object 201 through a signal processing module based on the amount of electric charges measured in different phases using a ToF scheme in the 3D image sensor 1100. The controller 1400 may include and/or may be implemented by a memory device 1401 (e.g., storage device) storing a program of instructions and a processor 1402 (e.g., processing circuitry) that may execute the program of instructions stored on the memory device 1401. The signal processor 1500 may include and/or may be implemented by a memory device 1501 (e.g., storage device) storing a program of instructions and a processor 1502 (e.g., processing circuitry) that may execute the program of instructions stored on the memory device 1501. In some example embodiments, memory devices 1401 and 1501 are the same memory device and/or processor 1402 and 1502 are the same processor.

Referring to FIG. 14B, an electronic device 1000a according to some example embodiments may be different from the electronic device 1000 of FIG. 14A in a sense that the 3D image sensor 1100a has the second coupling structure where a polarizer 1140 is arranged on the depth pixel 1120. For example, the 3D image sensor 1100a may include the depth pixel 1120 and the polarizer 1140. The depth pixel 1120 may be an active-type depth pixel, for example, a ToF-based depth pixel. For example, the 3D image sensor 1100a in the electronic device 1000a according to some example embodiments may be the 3D image sensor 100aa-I through 100fa-I of FIGS. 10A through 11. However, in the electronic device 1000a according to some example embodiments, the 3D image sensor 1100a is not limited thereto.

The light irradiator 1200, the lens 1300, the controller 1400, and the signal processor 1500 are as described for the electronic device 1000 of FIG. 14A.

Figure 15A:
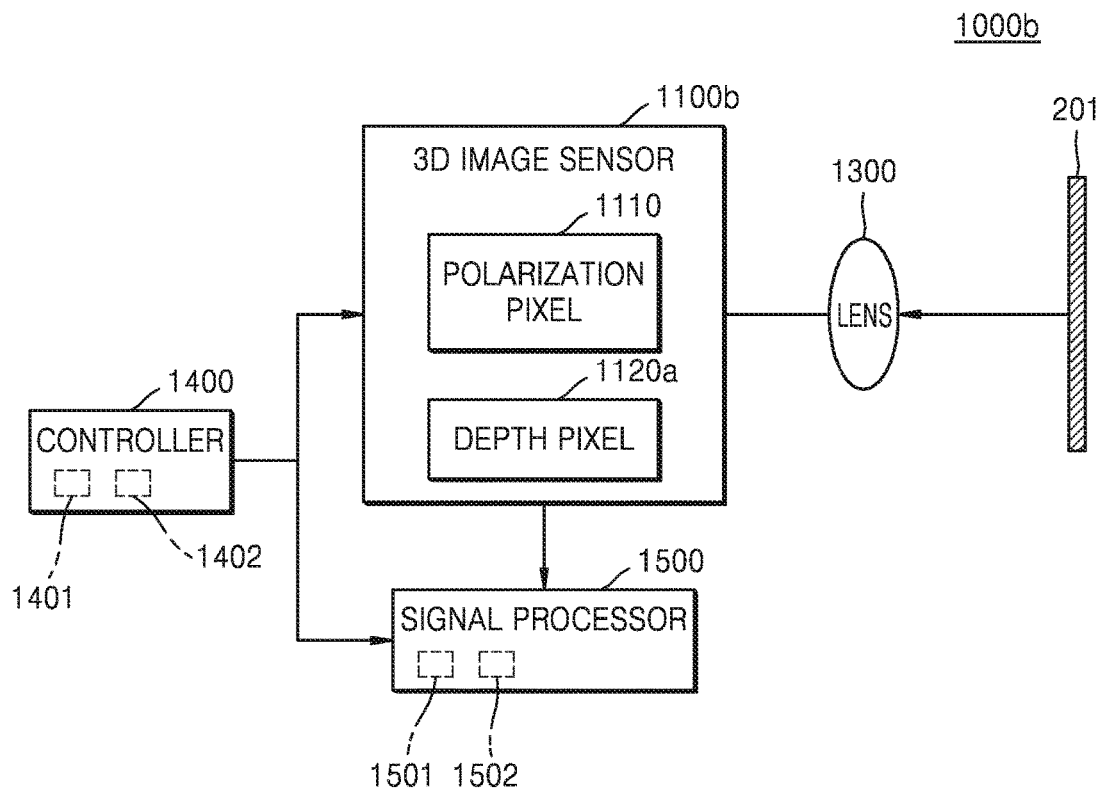
FIGS. 15A and 15B are schematic diagrams of an electronic device including a 3D image sensor of a passive type according to some example embodiments of the inventive concepts.
Figure 15B:
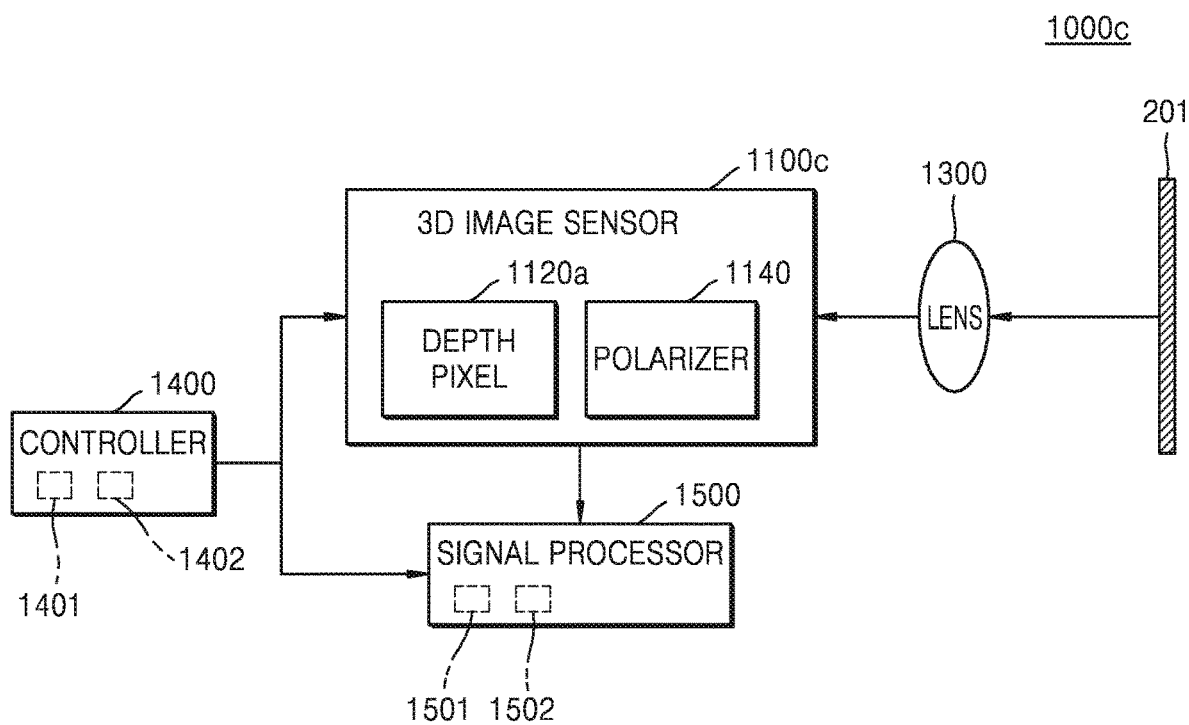

FIGS. 15A and 15B are schematic diagrams of an electronic device including a 3D image sensor of a passive type according to some example embodiments of the inventive concepts.

Referring to FIG. 15A, an electronic device 1000b according to some example embodiments may differ from the electronic device 1000 of FIG. 14A in that the electronic device 1000b does not include a separate light irradiator. More specifically, in the electronic device 1000b according to some example embodiments, a 3D image sensor 1100b may have the first coupling structure where a polarization pixel 1110 and a depth pixel 1120a are mixed. However, the depth pixel 1120a may be a passive-type depth pixel, for example, a multi-PD-based depth pixel. However, the depth pixel 1120 is not limited to the multi-PD type. The 3D image sensor 1100b may be, for example, the 3D image sensor 100ap-M through 100ep-M of FIGS. 7A through 8. However, the 3D image sensor 1100b is not limited thereto.

The lens 1300, the controller 1400, and the signal processor 1500 are as described for the electronic device 1000 of FIG. 14A.

Referring to FIG. 15B, an electronic device 1000c according to some example embodiments may differ from the electronic device 1000a of FIG. 14B in that the electronic device 1000c does not include a separate light irradiator. More specifically, in the electronic device 1000c according to some example embodiments, a 3D image sensor 1100c may have the second coupling structure where a polarizer 1140 is arranged on a depth pixel 1120a. However, the depth pixel 1120a may be a passive-type depth pixel, for example, a multi-PD-based depth pixel. However, the depth pixel 1120a is not limited to the multi-PD type. The 3D image sensor 1100c may be the 3D image sensor 100ap-I through 100dp-I of FIGS. 9A through 9C and 11. However, the 3D image sensor 1100c is not limited thereto.

The lens 1300, the controller 1400, and the signal processor 1500 are as described for the electronic device 1000 of FIG. 14A.

Figure 16:
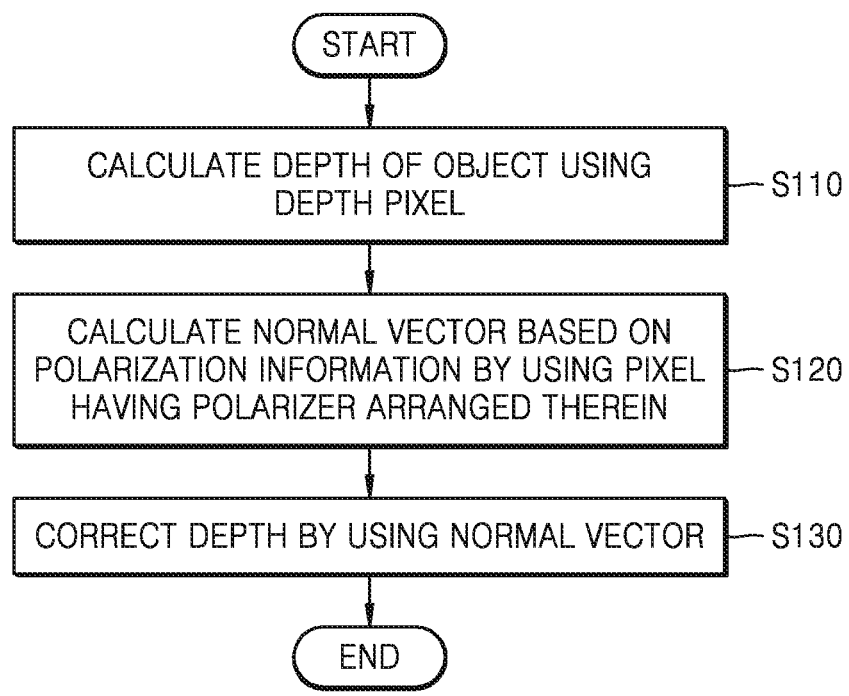
FIGS. 16 and 17 are flowcharts briefly showing depth correction methods according to some example embodiments of the inventive concepts.
Figure 17:
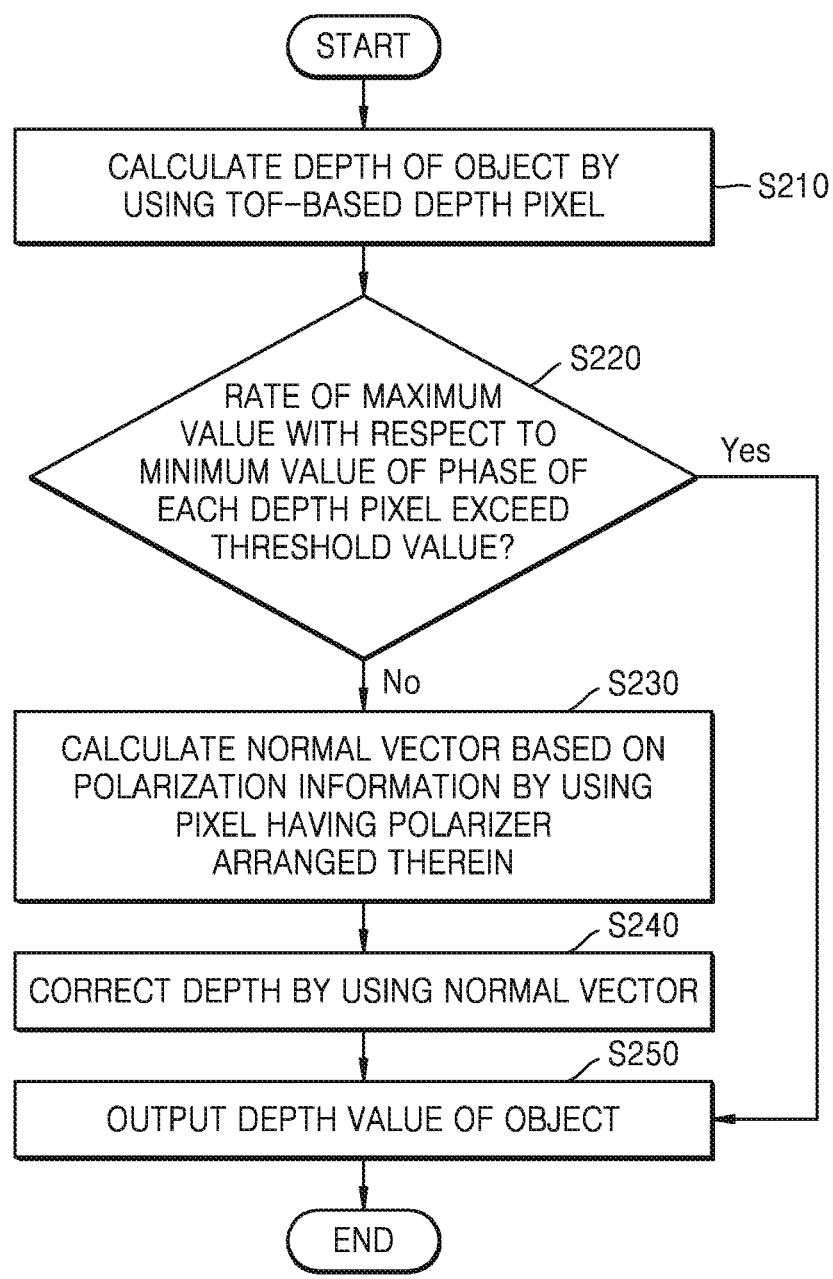

FIGS. 16 and 17 are flowcharts briefly showing depth correction methods according to some example embodiments of the inventive concepts. The methods illustrated in FIGS. 16-17 may be implemented by a controller 1400, a signal processor 1500, or both.

Referring to FIG. 16, a depth correction method according to some example embodiments includes calculating a depth of an object from the 3D image sensor based on processing sensor data generated by a depth pixel in response to the depth pixel detecting light reflected from the object in operation S110. The depth pixel may be, for example, a ToF-based depth pixel or a multi-PD-based depth pixel. However, the depth pixel is not limited thereto.

Next, a normal vector with respect to a surface of an object based on polarization information is calculated based on processing sensor data generated by a pixel having a polarizer arranged therein in response to the pixel having the polarizer therein detecting light reflected from the object in operation S120. Once the normal vector with respect to the surface of the object is calculated, the shape information of the surface of the object may be computed. Herein, the pixel having the polarizer arranged therein may mean the polarization pixel for the first coupling structure where the polarization pixel and the depth pixel are mixed, or the depth pixel for the second coupling structure where the polarizer is arranged on the depth pixel.

Next, the depth of the object is corrected based on the normal vector in operation S130. As such, by correcting the depth of the object using the normal vector with respect to the surface of the object, obtained through the polarization information, the depth information of the object, which accurately reflects the shape of the surface of the object may be detected.

Referring to FIG. 17, a depth correction method according to some example embodiments includes calculating a depth of an object from the 3D image sensor based on processing sensor data generated by a ToF-based depth pixel in response to the depth pixel detecting light reflected from the object in operation S210.

Next, in operation S220, a rate of maximum values with respect to minimum values of phases of depth pixels exceeds a threshold value in operation S220. For example, when a rate of maximum values with respect to minimum values of the phases is 1.0, it means that there is no modulation information, and thus the depth of the object may not be calculated in a ToF manner. Herein, the maximum value and the minimum value of the phase may mean a maximum value and a minimum value of the amount of electric charges detected for each phase. For example, by designating the threshold value to 1.01 and determining whether the rate of the maximum values with respect to the minimum values of the phases exceeds the threshold value, reliable ToF-based depth calculation may be selected.

When the rate of the maximum values with respect to the minimum values of the phases does not exceed the threshold value (No), the normal vector with respect to the surface of the object based on polarization information is calculated based on processing sensor data generated by the pixel having the polarizer arranged therein, in response to the pixel having the polarizer therein detecting light reflected from the object, in operation S230. The pixel having the polarizer arranged therein may be the polarization pixel or the depth pixel depending on the first coupling structure or the second coupling structure.

Next, the depth of the object is corrected using the normal vector in operation S240. The corrected depth of the object is computed as the depth of the object in operation S250.

Meanwhile, when the rate of the maximum values with respect to the minimum values of the phases exceeds the threshold value (Yes), the depth of the object calculated in the ToF manner is computed as the depth of the object in operation S250. In other words, correction may not be performed with respect to the depth of the object by using the polarization information. Restated, the depth correction method may include avoiding correcting the depth in response to a determination that the rate exceeds the threshold value.

Figure 18:
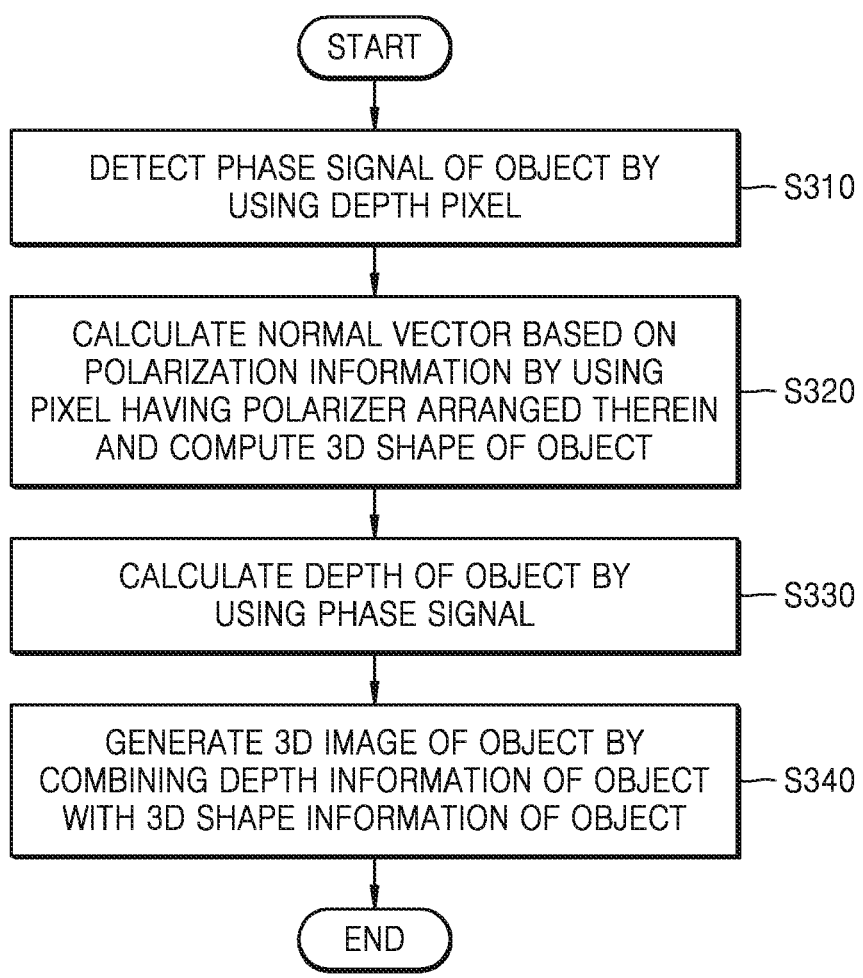
FIG. 18 is a flowchart briefly showing a 3D image generation method according to some example embodiments of the inventive concepts.

FIG. 18 is a flowchart briefly showing a 3D image generation method according to some example embodiments of the inventive concepts. The method illustrated in FIG. 18 may be implemented by a controller 1400, a signal processor 1500, or both.

Referring to FIG. 18, a method of generating a 3D image according to some example embodiments includes detecting a phase signal of an object based on processing sensor data generated by a depth pixel in response to the depth pixel detecting light reflected from the object in operation S310. The depth pixel may be, for example, a ToF-based depth pixel or a multi-PD-based depth pixel. However, the depth pixel is not limited thereto.

Next, a normal vector with respect to a surface of the object based on polarization information is calculated based on processing sensor data generated by a pixel having a polarizer arranged therein in response to the pixel having the polarizer therein detecting light reflected from the object, and a 3D shape of the object is computed in operation S320. The pixel having the polarizer arranged therein may be the polarization pixel or the depth pixel depending on the first coupling structure or the second coupling structure. The 3D shape of the object may mean a 3D shape of the surface of the object.

The depth of the object is calculated based on the detected phase signal of the object in operation S330. According to some example embodiments, calculation of the depth of the object may be performed in operation S310 of detecting the phase signal of the object.

The 3D image of the object is generated based on combining depth information associated with the calculated depth and 3D shape information associated with the computed 3D shape of the object in operation S340. With the method of generating a 3D image according to some example embodiments, by combining the depth information of the object and the 3D shape information of the surface of the object, the 3D image of the object may be generated which accurately reflects the depth of the object and the shape of the surface of the object. In some example embodiments, the calculating of the depth of the object is performed prior to the computing of the 3D shape.

The 3D image sensor including the polarizer according to the technical spirit of the inventive concepts includes a structure in which the polarizer and the depth pixel are combined, for example, the first coupling structure where the polarization pixel including the polarizer and the depth pixel are mixed or the second coupling structure where the polarizer is arranged on the depth pixel, thereby solving the inaccuracy of the shape information of the surface of the object provided by an existing 3D image sensor including a depth pixel and the impossibility of measurement of the depth of the object provided by a polarization sensor including a polarization pixel, and thus accurately detecting depth information of the object by reflecting the shape information of the surface of the object.

While the inventive concepts has been described with reference to the embodiments illustrated in the figures, it will be understood by those of ordinary skill in the art that various changes and other equivalent embodiments may be possible therefrom. Therefore, the true technical scope of the inventive concepts should be defined by the technical spirit of the appended claims.

What is claimed is:

1. A three-dimensional (3D) image sensor, the 3D image sensor comprising:
   a depth pixel, the depth pixel including a charge generation region in a substrate, the depth pixel configured to generate depth information associated with a depth of an object from the 3D image sensor in a 3D scene based on detecting light reflected from the object; and
   at least two polarization pixels adjacent to the depth pixel, each polarization pixel including a photodiode in the substrate and a polarizer on the substrate in a light-incident direction, each polarization pixel configured to generate shape information associated with a shape of a surface of the object in the 3D scene based on detecting light reflected from the object,
   wherein the at least two polarization pixels and the depth pixel collectively define a unit pixel,
   wherein the respective polarizers of the at least two polarization pixels are associated with different polarization directions.

2. The 3D image sensor of claim 1, wherein
   the depth pixel includes a pixel of a time of flight (ToF)-based 3D sensor, and
   the depth pixel has a pixel structure that is
     a 1-tap pixel structure,
     a 2-tap pixel structure, or
     a 4-tap pixel structure.

3. The 3D image sensor of claim 2, wherein the ToF-based 3D sensor is configured to operate according to a gate modulation method.

4. The 3D image sensor of claim 2, wherein the unit pixel has
   a first structure including four depth pixels and four polarization pixels that collectively define a checkerboard pattern of alternating depth pixels and polarization pixels,
   a second structure including
     four polarization pixels having a 2×2 array structure, and one depth pixel having a sensor area corresponding to a cumulative sensor area of two polarization pixels of the four polarization pixels, the one depth pixel adjacent to the two polarization pixels, a third structure including four depth pixels in a center of the third structure, and twelve polarization pixels in a periphery of the third structure and having a 4×4 array structure, or a fourth structure including twelve polarization pixels in a periphery of the fourth structure, and one depth pixel, which has a sensor area corresponding to a cumulative sensor area of four polarization pixels of the twelve polarization pixels and is in a center of the fourth structure.

5. The 3D image sensor of claim 4, wherein the unit pixel has the first structure, the second structure, or the third structure, and the depth pixel has the 2-tap pixel structure, or the unit pixel has the fourth structure, and the depth pixel has the 4-tap pixel structure.

6. The 3D image sensor of claim 2, wherein the depth pixel has a sensor area corresponding to a cumulative sensor area of four polarization pixels and has the 4-tap pixel structure, and the unit pixel has a density structure that is a first density structure including two depth pixels and eight polarization pixels, a second density structure including one depth pixel and twelve polarization pixels, or a third density structure including one depth pixel and thirty-two polarization pixels.

7. The 3D image sensor of claim 2, wherein the 3D image sensor includes a plurality of unit pixels, the plurality of unit pixels including the unit pixel, each unit pixel of the plurality of unit pixels includes four depth pixels and two polarization pixels and has a structure in which the four depth pixels define separate, respective vertices of a rectangle, four polarization pixels are in four sides of the rectangle, such that a diagonal of each polarization pixel is aligned with a separate side of the four sides of the rectangle, each polarization pixel of the four polarization pixels shared with an adjacent unit pixel of the plurality of unit pixels, and the plurality of unit pixels define an alternating pattern of depth pixels and polarization pixels in two diagonal directions, each diagonal direction of the two diagonal directions extending along a different diagonal of the rectangle.

8. The 3D image sensor of claim 2, wherein the depth pixel has the 4-tap pixel structure, and the 4-tap pixel structure includes the polarizer in two tap portions associated with at least one polarization pixel and the depth pixel in another two tap portions, and one 4-tap pixel structure includes two polarizers having a same polarization direction, or two polarizers having two different polarization directions.

9. The 3D image sensor of claim 1, wherein the depth pixel is a pixel of a multi-photodiode (PD)-based 3D sensor and has a pixel structure that is a 2PD pixel structure, a 4PD pixel structure, or a super-PD pixel structure, and the depth pixel includes a microlens on the substrate in the light-incident direction.

10. The 3D image sensor of claim 9, wherein the unit pixel has a first structure including four depth pixels and four polarization pixels and having a checkerboard structure, a second structure including four polarization pixels having a 2×2 array structure, and one depth pixel having a size amounting to two polarization pixels among the four polarization pixels, the one depth pixel adjacent to the two polarization pixels of the second structure, a third structure including four depth pixels in a center of the third structure, and twelve polarization pixels in a periphery of the third structure and having a 4×4 array structure, or a fourth structure including twelve polarization pixels in a periphery of the fourth structure, and one depth pixel, which has a sensor area corresponding to a cumulative sensor area of four polarization pixels and is in a center of the fourth structure.

11. The 3D image sensor of claim 9, wherein the 3D image sensor includes a plurality of unit pixels, the plurality of unit pixels including the unit pixel, each unit pixel of the plurality of unit pixels includes four depth pixels and two polarization pixels and has a structure in which the four depth pixels define separate, respective vertices of a rectangle, four polarization pixels at least partially define separate, respective sides of four sides of the rectangle, each polarization pixel of the four polarization pixels shared with an adjacent unit pixel of the plurality of unit pixels, and the plurality of unit pixels define an alternative pattern of depth pixels and polarization pixels in two diagonal directions, each diagonal direction of the two diagonal directions extending along a different diagonal of the rectangle.

12. The 3D image sensor of claim 1, wherein each polarizer includes a metal grating or high-dielectric material grating on the substrate, or a concave-convex portion in the substrate.

13. A three-dimensional (3D) image sensor, the 3D image sensor comprising:

a unit pixel, the unit pixel including a charge generation region in a center of a pixel in a substrate; and at least two polarizers on the substrate in a light-incident direction, the at least two polarizers associated with different polarization directions, wherein the 3D image sensor is configured to generate depth information associated with a depth of an object from the 3D image sensor in a 3D scene based on detecting light reflected from the object and shape information associated with a shape of a surface of the object in the 3D scene based on detecting light reflected from the object.

14. The 3D image sensor of claim 13, wherein the 3D image sensor is a multi-photodiode (PD)-based 3D sensor and further includes a microlens on at least one polarizer of the at least two polarizers, and the unit pixel has a pixel structure that is a 2PD pixel structure, a 4PD pixel structure, or a super PD pixel structure.

15. The 3D image sensor of claim 14, wherein the unit pixel includes four pixels having a 2×2 array structure, the four pixels include corresponding 0°, 45°, 90°, and 135° polarizers, respectively, and the pixel structure of the unit pixel is
- a 2-shared 2PD pixel structure,
- a 4-shared 2PD pixel structure, or
- a 4-shared 4-PD pixel structure.

16. The 3D image sensor of claim 13, wherein the 3D image sensor is a time of flight (ToF)-based 3D sensor, and the pixel has a pixel structure that is
- a 1-tap pixel structure,
- a 2-tap pixel structure, or
- a 4-tap pixel structure.

17. The 3D image sensor of claim 13, wherein the unit pixel has
- a first structure including four pixels in a 2×2 array structure in which each pixel of the four pixels has a 2-tap pixel structure and the four pixels include corresponding 0°, 45°, 90°, and 135° polarizers, respectively;
- a second structure including eight pixels in a 2×4 array structure in which each pixel of the eight pixels has the 2-tap pixel structure, and each two of the eight pixels form 4 taps and include 0°, 45°, 90°, and 135° polarizers corresponding to the four taps, respectively;
- a third structure including four pixels in the 2×2 array structure in which each pixel of the four pixels has the 1-tap pixel structure and the four pixels include corresponding 0°, 45°, 90°, and 135° polarizers, respectively;
- a fourth structure including sixteen pixels in a 4×4 array structure in which each pixel of the sixteen pixels has the 1-tap pixel structure, and each four pixels of the sixteen pixels form 4 taps and include 0°, 45°, 90°, and 135° polarizers corresponding to the four taps, respectively; and
- a fifth structure including four pixels in the 2×2 array structure in which each pixel of the four pixels has the 4-tap pixel structure and the four pixels include corresponding 0°, 45°, 90°, and 135° polarizers, respectively.

18. The 3D image sensor of claim 13, wherein the unit pixel includes four polarizers in a 2×2 array structure in which polarizers having two polarization directions that are perpendicular to each other at least partially define a checkerboard pattern.

19. The 3D image sensor of claim 13, wherein each polarizer includes
- a metal grating or high-dielectric material grating on the substrate, or
- a concave-convex portion in the substrate.

20. The 3D image sensor of claim 13, wherein a boundary of the pixel at least partially defines a deep trench isolation (DTI) structure.

* * * * *